United States Patent
Koyama et al.

(10) Patent No.: US 6,936,846 B2
(45) Date of Patent: Aug. 30, 2005

(54) SELF-LUMINOUS DEVICE AND ELECTRIC MACHINE USING THE SAME

(75) Inventors: Jun Koyama, Kanagawa (JP); Kazutaka Inukai, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 23 days.

(21) Appl. No.: 09/835,551

(22) Filed: Apr. 17, 2001

(65) Prior Publication Data

US 2002/0021266 A1 Feb. 21, 2002

(30) Foreign Application Priority Data

Apr. 17, 2000 (JP) .................................... 2000-114592

(51) Int. Cl.[7] .................................... H01L 27/105
(52) U.S. Cl. ...................... 257/71; 257/59; 313/504
(58) Field of Search ..................... 313/487, 495, 313/503, 504; 257/59, 67–72; 315/169.3

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/507 |
| 4,720,432 A | 1/1988 | VanSlyke et al. | 428/457 |
| 4,769,292 A | 9/1988 | Tang et al. | 428/690 |
| 4,885,211 A | 12/1989 | Tang et al. | 428/457 |
| 4,950,950 A | 8/1990 | Perry et al. | 313/504 |
| 5,047,687 A | 9/1991 | VanSlyke | 313/503 |
| 5,059,861 A | 10/1991 | Littman et al. | 313/503 |
| 5,059,862 A | 10/1991 | VanSlyke et al. | 430/569 |
| 5,061,617 A | 10/1991 | Maskasky | 313/503 |
| 5,073,446 A | 12/1991 | Scozzafava et al. | 428/323 |
| 5,151,629 A | 9/1992 | VanSlyke | 313/504 |
| 5,294,869 A | 3/1994 | Tang et al. | 313/504 |
| 5,294,870 A * | 3/1994 | Tang et al. | 313/504 |
| 5,550,066 A | 8/1996 | Tang et al. | 437/40 |
| 5,641,991 A | 6/1997 | Sakoh | 257/755 |
| 5,643,826 A | 7/1997 | Ohtani et al. | 437/88 |
| 5,839,456 A | 11/1998 | Han | 134/104.1 |
| 5,882,761 A | 3/1999 | Kawami et al. | 428/69 |
| 5,923,962 A | 7/1999 | Ohtani et al. | 438/150 |
| 5,966,189 A | 10/1999 | Matsuo | 349/38 |
| 6,593,592 B1 * | 7/2003 | Yamazaki et al. | 257/71 |

FOREIGN PATENT DOCUMENTS

| | | |
|---|---|---|
| EP | 0717445 A2 | 6/1996 |
| EP | 0776147 A1 | 5/1997 |
| JP | 62-090260 | 4/1987 |
| JP | 10-189525 | 7/1998 |

OTHER PUBLICATIONS

Tsutsui et al., "Electroluminescence in Organic Thin Films", Photochemical Processes in Organized Molecular Systems, 1991, pp. 437–450.

(Continued)

Primary Examiner—Wilson Lee
(74) Attorney, Agent, or Firm—Fish & Richardson P.C.

(57) ABSTRACT

To provide a self-luminous device capable of clear, multi-gray scale, color display and an electric machine provided with the same. Gray scale display is attained by a time division driving method in which an EL element (109) provided in a pixel (104) is controlled to emit light or not to emit light by means of time, thereby avoiding being affected by fluctuation in characteristic in current controlling TFTs (108).

16 Claims, 30 Drawing Sheets

OTHER PUBLICATIONS

M. A. Baldo et al., "Highly Efficient Phosphorescent Emission from Organic Electroluminescent Devices", Nature vol. 395, Sep. 10, 1998, pp. 151–154.

M. A. Baldo et al., "Very High–Efficiency Green Organic Light–Emitting Devices Based on Electrophosphorescence", Applied Physics Letters vol. 75, No. 1, Jul. 5, 1999, pp. 4–6.

Tsutsui et al., "High Quantum Efficiency in Organic Light–Emitting Devices with Iridium–Complex as a Triplet Emissive Center", Japanese Journal of Applied Physics vol. 38, Part 12B, Dec. 15, 1999, pp. L1502–L1504.

Japanese Patent Application Laid–Open No. 07–130652 (English Abstract attached) May 19, 1995.

Japanese Patent Application Laid–Open No. 62–090265 (English Abstract attached) Apr. 24, 1987.

Japanese Patent Application Laid–Open No. 8–78159 (English Abstract attached) Mar. 22, 1996.

Japanese Patent Application Laid–Open No. 9–148066 (English Abstract attached) Jun. 6, 1997.

Japanese Patent Application Laid–Open No. 8–241048 (English Abstract attached) Sep. 17, 1996.

* cited by examiner

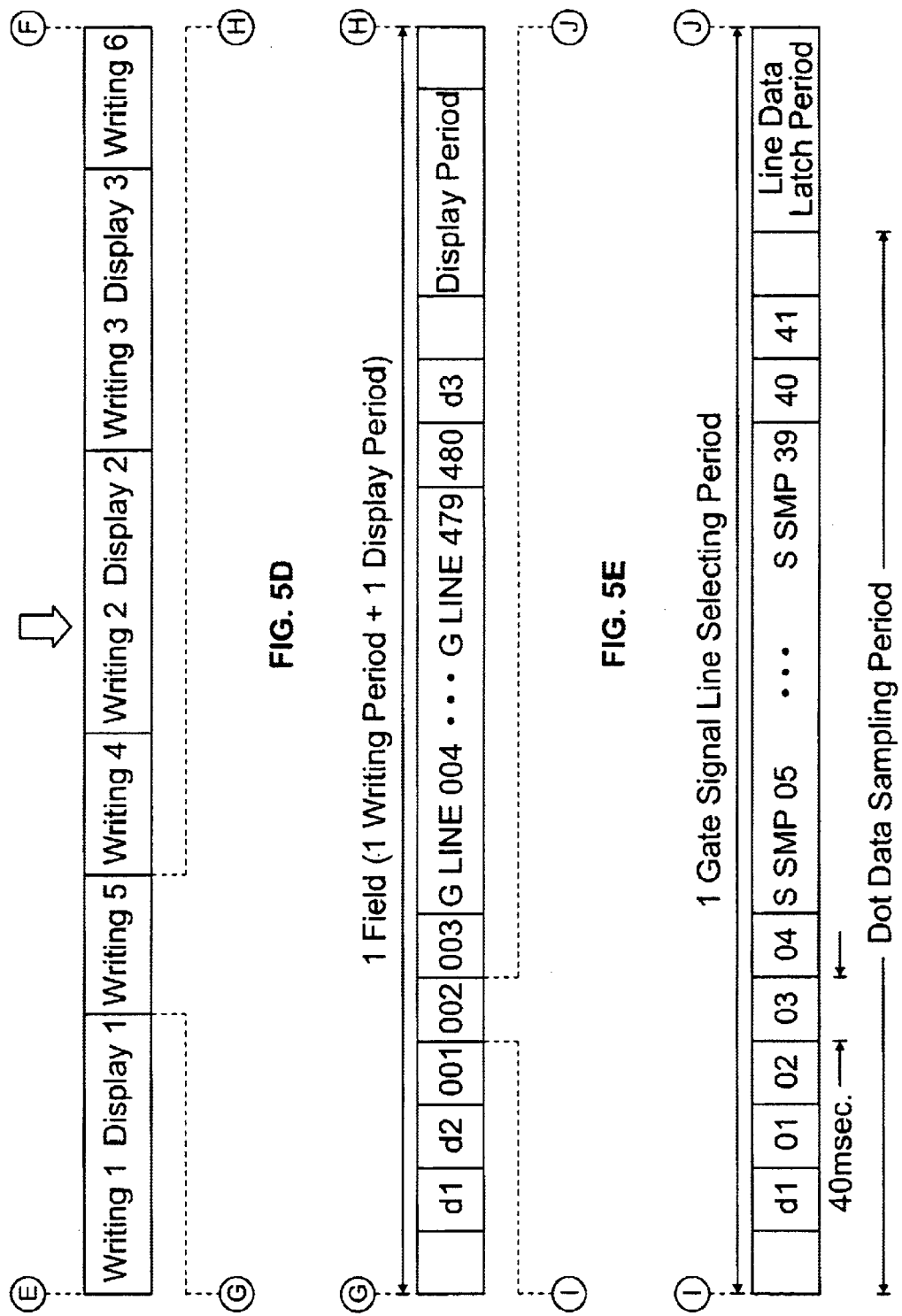

M1,M2 ; L=11W,W=250X2 [μm]
C1,C2 ; S=0.20X0.08 [mm²] (GTa-Al)
R ; L=673,W=5 [μm] (LDDSi)

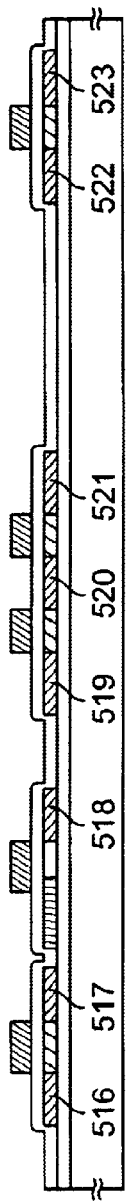
FIG. 14A
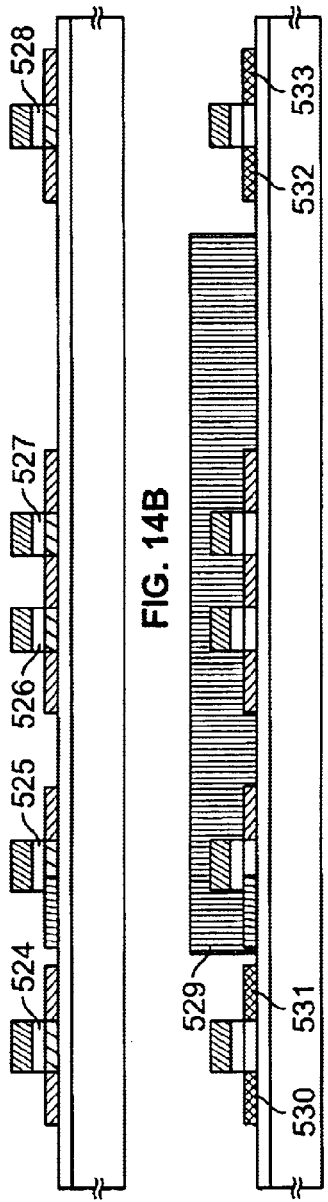
FIG. 14B
FIG. 14C
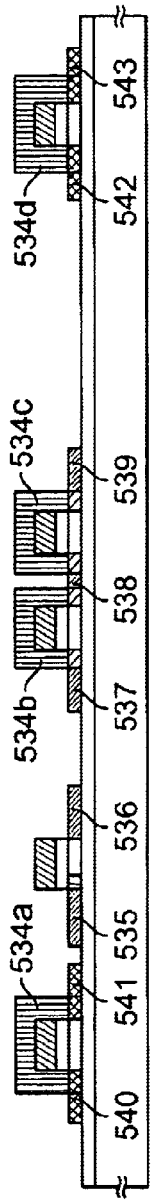
FIG. 14D
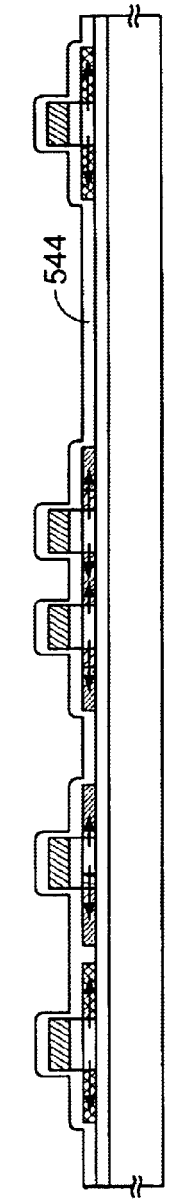
FIG. 14E

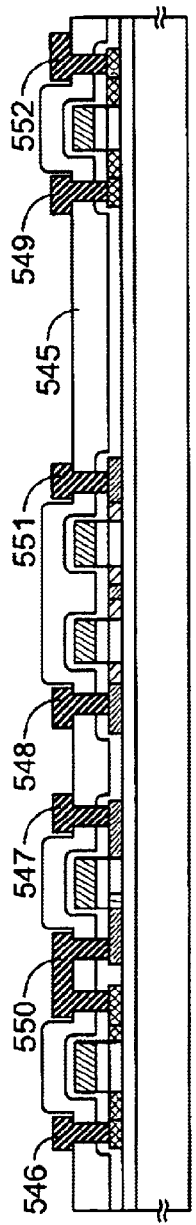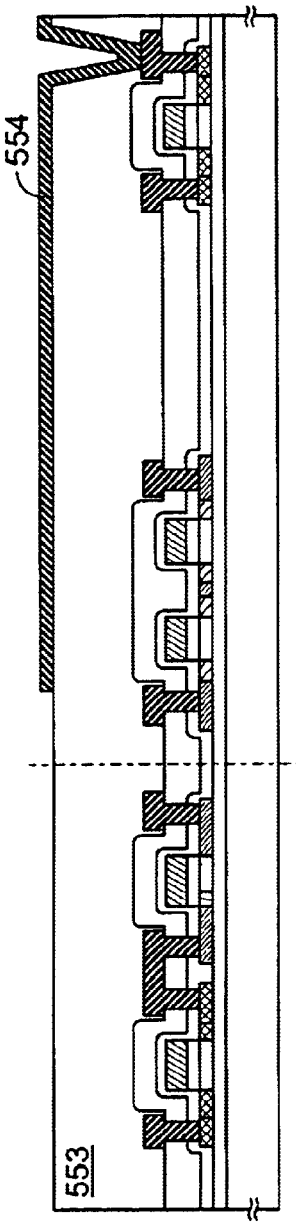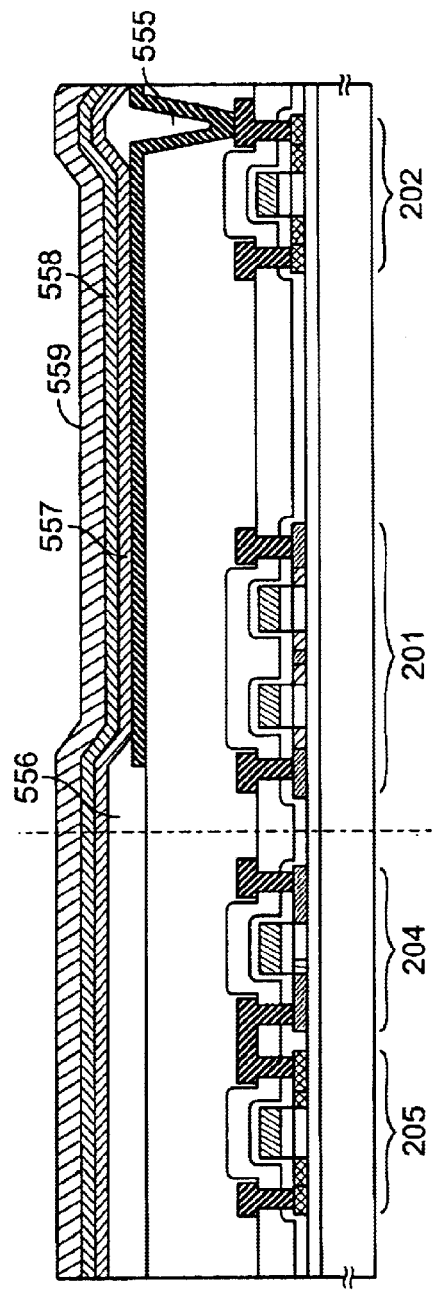
FIG. 15A
FIG. 15B
FIG. 15C

Structures of OLED (A)

(B)

SELF-LUMINOUS DEVICE AND ELECTRIC MACHINE USING THE SAME

BACKGROUND OF THE INVENTION

1. Field of the Invention

The present invention relates to a self-luminous device (or an EL display device) manufactured by forming a light emitting element (such as an EL (Electro Luminescence) element) on a substrate, and an electric machine having the self-luminous device as a display (display unit). The light emitting element here is also called an OLED (Organic Light Emitting Device).

The light emitting element has a layer containing an EL material that can provide EL (Electro Luminescence: the luminescence generated by applying an electric field) (hereinafter referred to as EL layer), in addition to an anode and a cathode. The luminescence generated from an EL material includes light emission (fluorescence) upon returning from the singlet excitation to the ground state and light emission (phosphorescence) upon returning from the triplet excitation to the ground state. The self-luminous device of the present invention can use both types of light emitting elements with one type containing fluorescent EL materials and the other type containing phosphorescent EL materials.

2. Description of the Related Art

The technology for forming a TFT on a substrate has made a great progress in recent years, and application of the thus formed TFT to an active matrix display device is being developed. In particular, a TFT formed of a polysilicon film has a field mobility (often abbreviated as mobility) higher than that of a conventional TFT that is formed of an amorphous silicon film, and hence is capable of operating at high speed.

An active matrix self-luminous device has a pixel structure generally as the one shown in FIG. 3. In FIG. 3, reference symbol 301 denotes a TFT functioning as a switching element (hereinafter referred to as switching TFT), 302, a TFT functioning as an element for controlling current supplied to an EL element 303 (current controlling element) (hereinafter referred to as current controlling TFT), and 304, a capacitor (storage capacitor). The switching TFT 301 is connected to a gate wiring 305 and a source wiring (data line) 306. The current controlling TFT 302 has a drain region connected to the EL element 303 and has a source region connected to a power supply line 307.

When the gate wiring 305 is selected, a gate of the switching TFT 301 is opened, a data signal from the source wiring 306 is stored in the capacitor 304, and a gate of the current controlling TFT 302 is opened. After the gate of the switching TFT 301 is closed, the gate of the current controlling TFT 302 is kept open due to the electric charges stored in the capacitor 304 and the EL element 303 emits light during the gate is opened. How much light is emitted from the EL element varies depending on the amount of current flowing therethrough.

In other words, an analog-driven gray scale display, the amount of light emitted from the EL element varies as a result of control over the amount of current flowing into the gate of the current controlling TFT 302 by means of a data signal inputted from the source wiring 306.

FIG. 4A is a graph showing a transistor characteristic of the current controlling TFT. Denoted by reference symbol 401 is a curve showing a so-called Id-Vg characteristic (also called Id-Vg curve), where Id represents drain current and Vg represents gate voltage. With this graph, one can tell how much current will flow at a given gate voltage.

When driving the EL element, the voltage within an area indicated by a dotted line 402 around the curve of the Id-Vg characteristic is usually used. The area enclosed by the line 402 is enlarged in FIG. 4B.

In FIG. 4B, the shaded area is called a sub-threshold region. The term actually denotes a region in which the gate voltage is about the same as a threshold voltage ($V_{TH}$). When the gate voltage changes in this region, the drain current is changed exponentially. The current control is made by using the gate voltage of this region.

A data signal inputted in a pixel when the switching TFT 301 of FIG. 3 is opened is first stored in the capacitor 304, and the signal serves as the gate voltage for the current controlling TFT 302 without undergoing any change. At this point, the gate voltage determines the drain current in a 1:1 ratio in accordance with the Id-Vg characteristic shown in FIG. 4A. Thus a given amount of current flows in the EL element 303 in accordance with the data signal, and the EL element emits light in an amount corresponding to this given amount of current.

As described above, the amount of light emitted from the EL element is controlled by means of the inputted signal, and the control over the amount of light to be emitted provides gray scale display. This is a method so-called analog gray scale in which gray scale display is provided by variations in signal amplitude.

However, the analog gray scale method has a drawback and it is helpless against fluctuation in characteristic of TFTs. As an example, let's assume the case where the Id-Vg characteristic of one switching TFT differs from the Id-Vg characteristic of its adjacent pixel's switching TFT allocated for the same scale as the one switching TFT in gray scale display (which means shift toward plus or minus on the whole).

The switching TFTs in this case differ from each other in drain current, depending on how much the characteristics differ between the TFTs. This makes the gate voltage applied to one current controlling TFT in one pixel differ from the gate voltage applied to the other current controlling TFT in the adjacent pixel. Therefore different amounts of current flow in the two EL elements thereof to cause them to emit different amounts of light, with the result that the EL elements intended for the same scale in gray scale display now cannot play their intended roles.

Even when the same gate voltage is applied to the current controlling TFTs in the adjoining pixels, the current controlling TFTs cannot output the same amount of drain current if they are different from each other in Id-Vg characteristic. Moreover, as is apparent from FIG. 4A, the gate voltage used here is in the region where a change in gate voltage exponentially changes the drain current. Therefore if there is even a slightest difference in Id-Vg characteristic, equality in gate voltage does not always assure equality in amount of current outputted. Then it can be expected that EL elements in adjoining pixels may emit light in amounts greatly different from each other.

Since the fluctuation between switching TFTs and the fluctuation between current controlling TFTs affect synergistically, acceptable fluctuation in Id-Vg characteristic is in an even narrower range in actuality. The analog gray scale method is thus extremely sensitive to the fluctuation in characteristic of the TFTs, which forms an obstacle toward achieving multi-color display in conventional active matrix self-luminous devices.

SUMMARY OF THE INVENTION

The present invention has been made in view of the above problems, and an object of the present invention is therefore to provide an active matrix self-luminous device capable of clear, multi-gray scale, color display. Another object of the present invention is to provide an electric machine having such an active matrix self-luminous device as a display unit.

According to the present inventors' opinion, in order to obtain a pixel structure unsusceptible of fluctuation in TFT characteristic, a digital-driven gray scale method in which a current controlling TFT is used merely as a switching element for controlling current is more advantageous than the conventional analog-driven gray scale method in which how much light is emitted from an EL element is controlled by controlling the amount of current.

Then the present inventors have thought of an active matrix self-luminous device for displaying an image in digital-driven gray scale of time division method (hereinafter referred to as time division gray scale).

Further, speeding up of panel display is realized in this device by dividing a video line when a video signal is inputted to a source driver circuit so that plural data are inputted at once. The video signal here designates a data signal to be inputted to the source driver circuit defined in this specification.

FIGS. 5A to 5F show the entire drive timing over writing periods and display periods when an image is displayed in time division gray scale. Explained here is a case in which display is made in 64 gray scales by a 6 bit digital driving method. The writing period is a time period required for signals to be written into all pixels that constitute one frame. The display period is a time period during which pixels are lit up to display based on the written signals.

During the writing period, an EL driving power source is turned off (none of pixels are lighted) so as not to apply voltage to the EL elements in the pixels. On the other hand, the EL driving power source is turned on during the display period so that the voltage is applied to the EL elements in the pixels. If a data signal for lighting a pixel is inputted in this state, the pixel is lit up.

A time period an image in a display region takes to be displayed completely is one frame. In a general EL display, oscillation frequency is 60 Hz and, as shown in FIG. 5A, there are 60 frames in one second. For instance, when 6 bit digital gray scale (64 gray scales) display is made in the fourth frame, this one frame is divided into sixteen and the ratio of the writing periods to the display periods is set to 6:10, so that signals can be written 6 times in total during the writing periods (≈6.24 msec.) as shown in FIG. 5B. The writing made in 6 times will be denoted by Writing 1 to Writing 6 with Writing 1 completed first and Writing 6 completed last. The display periods will be denoted by Display 1 to Display 6 corresponding to Writing 1 to Writing 6, respectively.

The display periods are set so as to satisfy Display 1:Display 2:Display 3:Display 4:Display 5:Display 6=1:½:¼:⅛:1/16:1/32.

FIG. 5C shows the display periods establishing the above ratio in accordance with the 6 times writing (Writing 1 to Writing 6) during one frame.

Here numerical values written in the bottom of FIG. 5C indicate the relation between the length of the writing periods and the length of the display periods.

Specifically, the numerical values show that the display period (Display 1) for Writing 1 is 320 when the writing period is 63. When each writing period is 63, the display period in Display 2 is 160, the display period in Display 3 is 80, the display period in Display 4 is 40, the display period in Display 5 is 20, and the display period in Display 6 is 10.

One writing period (one Writing) and one display period (one Display) are put together to form one field. That means there are 6 fields in total in FIG. 5C which are the same in writing period but are different in display period. Here, the first field that appears first in forming one frame is called Field 1 (F1), and the rest of the fields, i.e., from the second field to the sixth field are called Field 2 (F2) to Field 6 (F6) in accordance with the order they appear.

However, the order in which Field 1 to Field 6 appear is not fixed. Combining appropriate display periods provides display in desired gray scale out of 64 gray scales.

The actual timing is set such that display periods are combined by dispersing the six fields different in display period as shown in FIG. 5D.

In FIG. 5D, given pixels are lit up during a period of Display 1, then Writing 5 is started, and Display 5 is started after finishing inputting data signals to all the pixels. Subsequently, data signals are inputted to all the pixels in Writing 4, followed by start of Display 4. In this way, given pixels are similarly lit up sequentially in Writing 2, Writing 3, and Writing 6 in their respective fields.

FIG. 5E shows Field 5 out of the six fields illustrated in FIG. 5D. Field 5 of FIG. 5E includes a period in which data is written when a certain gate wiring is selected by a data signal inputted from a gate circuit (Writing 5), and a display period in which pixels are lit up when a signal from a source wiring is inputted to the selected gate wiring (Display 5).

The illustration of FIGS. 5A to 5F is premised on VGA panel display (640×480 resolutions). Therefore there are 480 gate wirings, and a period for selecting all of the gate wirings including some dummies is the writing period of FIG. 5E.

A signal inputted from a source wiring in a writing period is called dot data. Dot data inputted from a source driver circuit during one gate selection period is sampled in a period shown in FIG. 5F. This indicates that the signal inputted from the source wiring is written while data is written in the gate selected in the writing period of FIG. 5E. The time period in which data are sampled at once is 40 nsec.

The dot data from the source driver circuit are inputted such that sixteen of them are simultaneously inputted for every 40 nsec. as shown in FIG. 5F.

The dot data selected in one gate selection period are held in respective latches 1 (6001) in the source driver circuit shown in FIG. 6 until all of the data are sampled. After sampling of all the data is completed, latch data are inputted from a latch line 6003 and all the data are simultaneously moved into latches 2 (6002). Note that a shift register 6004 selects video signals inputted from video lines 6006 in response to a clock pulse from a clock line 6005.

A line data latch period in FIG. 5F, separated from the sampling period, is a data moving period in which latch signals are inputted when the data are to be moved from the latches 1 (6001) to the latches 2 (6002).

Shown in FIG. 7 is a pixel structure in the active matrix self-luminous device according to the present invention. In FIG. 7, reference symbol 701 denotes a TFT functioning as a switching element (hereinafter referred to as switching TFT, or pixel TFT), 702, a TFT functioning as an element for controlling current supplied to an EL element 703 (current controlling element) (hereinafter referred to as current controlling TFT, or EL driving TFT), and 704, a capacitor (storage capacitor or auxiliary capacitor). The switching TFT 701 is connected to a gate wiring 705 and a source wiring (data line) 706. The current controlling TFT 702 has a drain region connected to the EL element 703 and has a source region connected to a power supply line (or current supply line) 707.

When the gate wiring 705 is selected, a gate of the switching TFT 701 is opened, a data signal from the source wiring 706 is stored in the capacitor 704, and a gate of the current controlling TFT 702 is opened. After the gate of the switching TFT 701 is closed, the gate of the current controlling TFT 702 is kept open due to the electric charges stored in the capacitor 704 and the EL element 703 emits light during the gate is opened. How much light is emitted from the EL element 703 varies depending on the amount of current flowing therethrough.

In other words, in digital-driven gray scale display, a data signal inputted from the source wiring 706 opens or closes the gate of the current controlling TFT 702 and the current flows when an EL driving power source is turned on to cause the EL element to emit light.

A function of the current controlling TFT of a pixel is to exert control over whether the pixel is lighted (display) or turned off (not-displayed) during the display period. Switching between a display period and a writing period is made by a power source to the right of the panel through an FPC terminal.

The power source (denoted by 709 in 72 of FIG. 7) installed outside the panel functions as a switch for switching between a writing period and a display period. In a writing period, data signals are inputted to the pixels while this power source is turned off (so as not to apply voltage to the pixels).

When inputting data to all the pixels is completed bringing the writing period to an end, the power source (709 in 72 of FIG. 7) is turned on to light pixels (display) at once. This period corresponds to the display period. The period in which the EL elements emit light to light the pixels is any of Display 1 to Display 6 out of the six fields.

One frame comes to an end after all of the six fields appear separately. At this point, gray scale of the pixel is controlled by adding up the display periods. If Display 1 and Display 2 are added together, for instance, 76% of luminance can be obtained in relation to full lighting of 100% luminance. If Display 3 and Display 5 are added together, the luminance obtained is 16%.

The descriptions above are for the case of 64 gray scales. However, the present invention is also capable or other gray scale display.

Assuming a case where N (N is an integer equal to or larger than 2) bit gray scale ($2^n$ gray scales) display is aimed, at first, one frame is divided into N fields (consisting of F1, F2, F3, ... F(n−1), and F(n)) in accordance with N bit gray scales as shown in FIG. 8. One frame will be divided into larger number of fields as the number of gray scales is increased, and a driver circuit accordingly has to be driven at a higher frequency.

Each of the N fields is further divided into a writing period (Ta) and a display period (Ts).

The display periods of the N fields F1, F2, F3, ... F(n−1), and F(n) are denoted by Ts1, Ts2, Ts3 ... Ts(n−1) and Ts(n), respectively. The display periods of the N fields are set so as to satisfy the relation of Ts1:Ts2:Ts3: ... :Ts(n−1):Ts(n)= $2^0:2^{-1}:2^{-2}: \ldots :2^{-(n-2)}: \ldots :2^{-(n-1)}$.

Under this condition, in one arbitrary field, pixels are sequentially selected (strictly speaking, switching TFTs of the pixels are selected) and a given gate voltage (namely, a data signal) is applied to gate electrodes of the current controlling TFTs. An EL element of a pixel to which a data signal for making current flow in the current controlling TFT emits light when the power source is turned on after the writing period is ended. The EL element thus lights the pixel during the display period allocated to this field.

This operation is repeated for all of the N fields. The gray scale for the respective pixels in one frame depends on the result of adding up the display periods. Accordingly, the gray scale of one arbitrary pixel is controlled by controlling the length of time during which the pixel is lit up for each field (how long each display period lasts).

As described above, a feature of the present invention is that, by using the digital-driven time division gray scale method in an active matrix self-luminous device, an image can be displayed in gray scale without being affected by TFT characteristics, which has been the problem in analog-driven gray scale display. Moreover, the present invention is successful in improving the aperture ratio of the pixels by arranging in a specific manner the storage capacitor formed in each pixel in the pixel portion in order to diminish fluctuation in characteristic of TFTs.

BRIEF DESCRIPTION OF THE DRAWINGS

In the accompanying drawings:

FIGS. 5A to 5F are diagrams illustrating an operation mode of a time division gray scale method;

FIGS. 14A to 14E are diagrams showing the process of manufacturing the self-luminous device;

FIGS. 15A to 15C are diagrams showing the process of manufacturing the self-luminous device;

DETAILED DESCRIPTION OF THE PREFERRED EMBODIMENTS

Figure 1A:
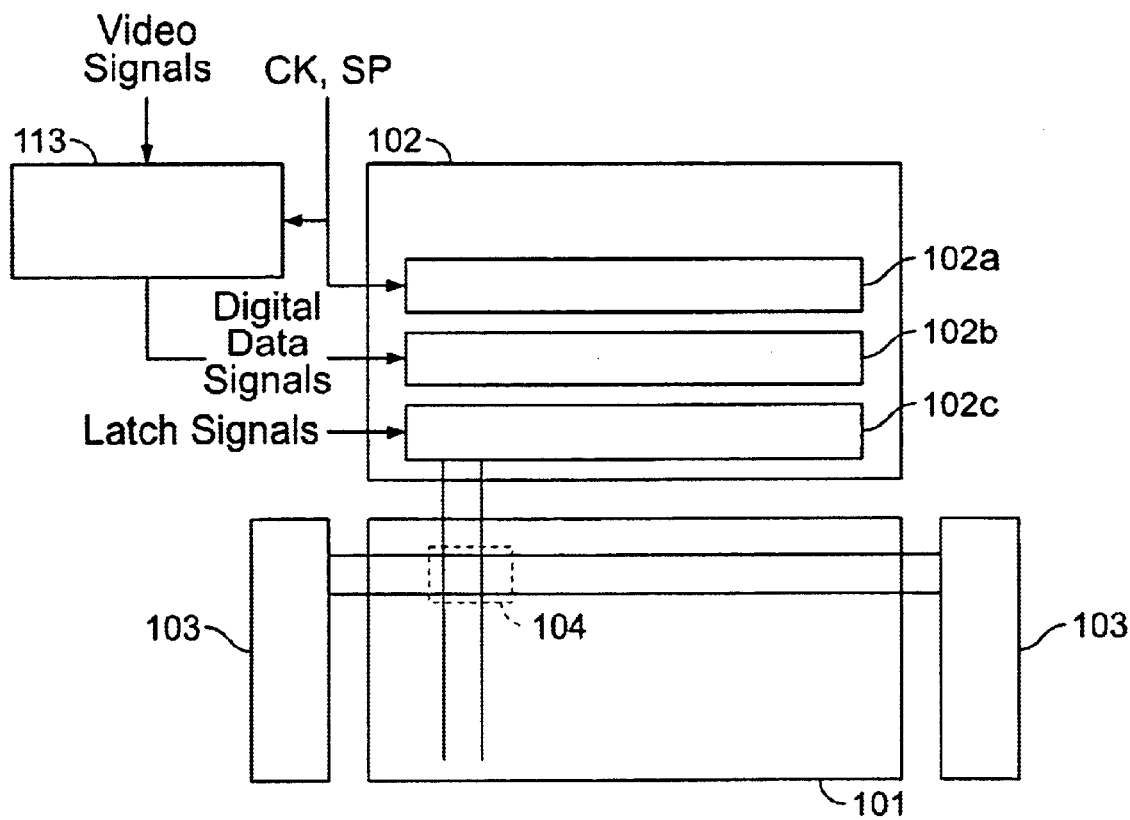
FIGS. 1A and 1B are diagrams showing the structure of a self-luminous device.
Figure 1B:
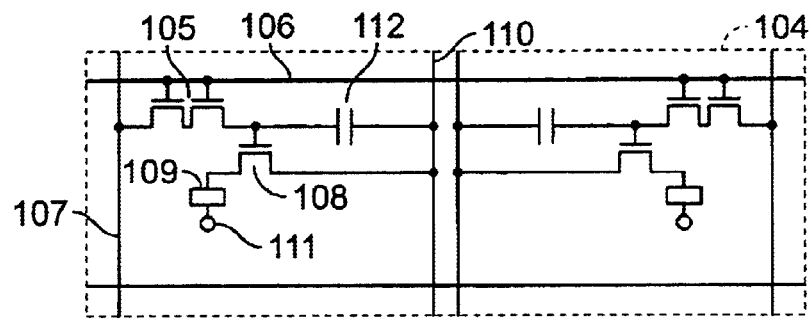

FIGS. 1A and 1B are schematic block diagrams showing an active matrix self-luminous device according to this embodiment mode. The active matrix self-luminous device shown in FIGS. 1A and 1B has TFTs formed on a substrate. The TFTs constitute a pixel portion 101 and a data signal side driver circuit 102 and gate signal driver circuits 103 with the three of them arranged on the periphery of the pixel portion. Denoted by 113 in the drawings is a time division gray scale data signal generating circuit (SPC: Serial-to-Parallel Conversion Circuit).

The data signal side driver circuit 102 has a shift register circuit 102a, a latch 1 (102b), and a latch 2(102c). Other than these, a buffer (not shown) is also included in the driver circuit 102.

Only one data signal side driver circuit is provided in the active matrix self-luminous device of this embodiment. However, two source signal side driver circuits may be provided such that the pixel portion is sandwiched between the two at its top and bottom.

Each of the gate signal side driver circuits 103 has a shift register, a buffer, and the like (none of them are shown).

The pixel portion 101 has 640×480 (width×length) pixels. Each pixel has a switching TFT and a current controlling TFT arranged therein. A switching TFT 105 is connected to a gate wiring 106 and a source wiring (data line) 107. A current controlling TFT 108 has a drain region connected to an EL element 109 and has a source region connected to a power supply line 110.

When the gate wiring 106 is selected, a gate of the switching TFT 105 is opened, a data signal from the source wiring 107 is stored in a capacitor 112, and a gate of the current controlling TFT 108 is opened. That is, the data signal inputted from the source wiring 107 causes current to flow in the current controlling TFT 108 so that the EL element emits light.

Now, the operation of the active matrix self-luminous device according to the present invention and the signal flow thereof are described.

The description given first is of the operation of the data signal side driver circuit 102. The data signal side driver circuit 102 includes, basically, the shift register 102a, the latch 1 (102b), and the latch 2(102c). A clock signal (CK) and a start pulse (SP) are inputted to the shift register 102a. The shift register 102a sequentially generates timing signals in response to the clock signal (CK) and the start pulse (SP). The generated timing signals are sequentially supplied through the buffer (not shown) to downstream circuits.

The timing signals from the shift register 102a are buffered and amplified by the buffer and the like. The source wiring to which the timing signals are supplied has a large load capacitance (parasitic capacitance) because many circuits or elements are connected to the source wiring. Rise and fall of the timing signals could be "dulled" by the load capacitance being large. Therefore the buffer is provided to prevent the dulling.

The timing signals (digital data signals) buffered and amplified by the buffer are supplied to the latch 1 (102b). The latch 1 (102b) has a latch for processing a 6 bit digital signal. Upon receiving the inputted timing signals, the latch 1 (102b) sequentially takes in 6 bit digital data signals supplied from the time division gray scale data signal generating circuit 104 and holds them inside.

A period of time required for writing digital data signals into all stages of the latch 1 (102b) is the writing period. Specifically, the writing period extends from a time point at which writing of a digital data signal into a latch of the leftmost stage of the latch 1 (102b) is started to a time point at which writing of a digital data signal into a latch of the rightmost stage is completed. The writing period may also be referred to as line period.

After the writing period is ended, latch signals start to be supplied to the latch 2 (102c) in timing with the operation of the shift register 102a. At this instant, the digital data signals that have been written and held in the latch 1 (102b) are sent to the latch 2 (102c) all at once and held there in the latch 2 (102c).

The latch 1 (102b) from which the digital signals have been sent to the latch 2 (102c) again sequentially takes in digital signals newly supplied from the time division gray scale data signal generating circuit 104 in response to timing signals from the shift register 102a.

Meanwhile, the latch 2 (102c) receives latch signals inputted thereto.

In each of the gate signal side driver circuits 103, timing signals from its shift register (not shown) are supplied to its not-shown buffer, and then supplied to corresponding gate wirings (scanning lines).

The time division gray scale data signal generating circuit (SPC: Serial-to-Parallel Conversion Circuit) 113 is a circuit for lowering the frequency of digital signals inputted from the external to 1/m of the original frequency. The frequency of a signal necessary for the operation of the driver circuits also can be lowered to 1/m of the original one by dividing the digital signals inputted from the external.

In the present invention, data signals inputted to the pixel portion is digital signals and, unlike liquid crystal display devices, voltage gray scale display is not employed by the present invention. Therefore digital data signals having information in the form of "0" or "1" can be inputted directly to the pixel portion.

The pixel portion 101 has a plurality of pixels 104 arranged in a matrix-like manner. FIG. 1B shows an enlarged view of the pixels 104. In FIG. 1B, the switching TFT 105 is connected to the gate wiring 106 into which a gate signal is inputted and to the source wiring 107 into which a video signal is inputted.

The current controlling TFT 108 has a gate connected to the drain region of the switching TFT 105. The current controlling TFT 108 has the drain region connected to the EL element 109 and has the source region connected to the power supply line 110. The EL element 109 is composed of an EL layer, an anode (pixel electrode) connected to the current controlling TFT 108, and a cathode (opposite electrode) provided so as to oppose the anode across the EL layer sandwiched therebetween. The cathode is connected to a given power source 111.

The switching TFT may either be an n-channel TFT or a p-channel TFT.

When the current controlling TFT 108 is an n-channel TFT, the drain region of the current controlling TFT 108 is connected to the cathode of the EL element 109 whereas the drain region of the current controlling TFT 108 is connected to the anode of the EL element 109 if the current controlling TFT 108 is a p-channel TFT.

A capacitor 112 is provided to hold the gate voltage of the current controlling TFT 108 when the switching TFT 105 is not selected (when it is in OFF state). The capacitor 112 is connected to the drain region of the switching TFT 105 and the power supply line 110.

Digital data signals to be inputted to the pixel portion structured as above are generated in the time division gray scale data signal generating circuit 113. This circuit converts a video signal (signal including image information) that is a digital signal into a digital data signal for time division gray scale display. The circuit 113 also generates a timing impulse necessary for time division gray scale display and other signals.

Typically, the time division gray scale data signal generating circuit 113 includes: means for dividing one frame into a plurality of fields corresponding to N (N is an integer of 2 or larger) bit gray scales; means for selecting the writing period or the display period in each of the plural fields; and means for setting the display periods so as to satisfy the relation of $Ts1:Ts2:Ts3: \ldots :Ts(n-1):Ts(n)=2^0:2^{-1}:2^{-2}: \ldots :2^{-(n-2)}:2^{-(n-1)}$.

The time division gray scale data signal generating circuit 113 may either be disposed outside the self-luminous device of the present invention or be formed unitarily. When the circuit 113 is disposed outside the self-luminous device, digital data signals generated in the circuit are inputted to the self-luminous device of the present invention.

Figure 2:
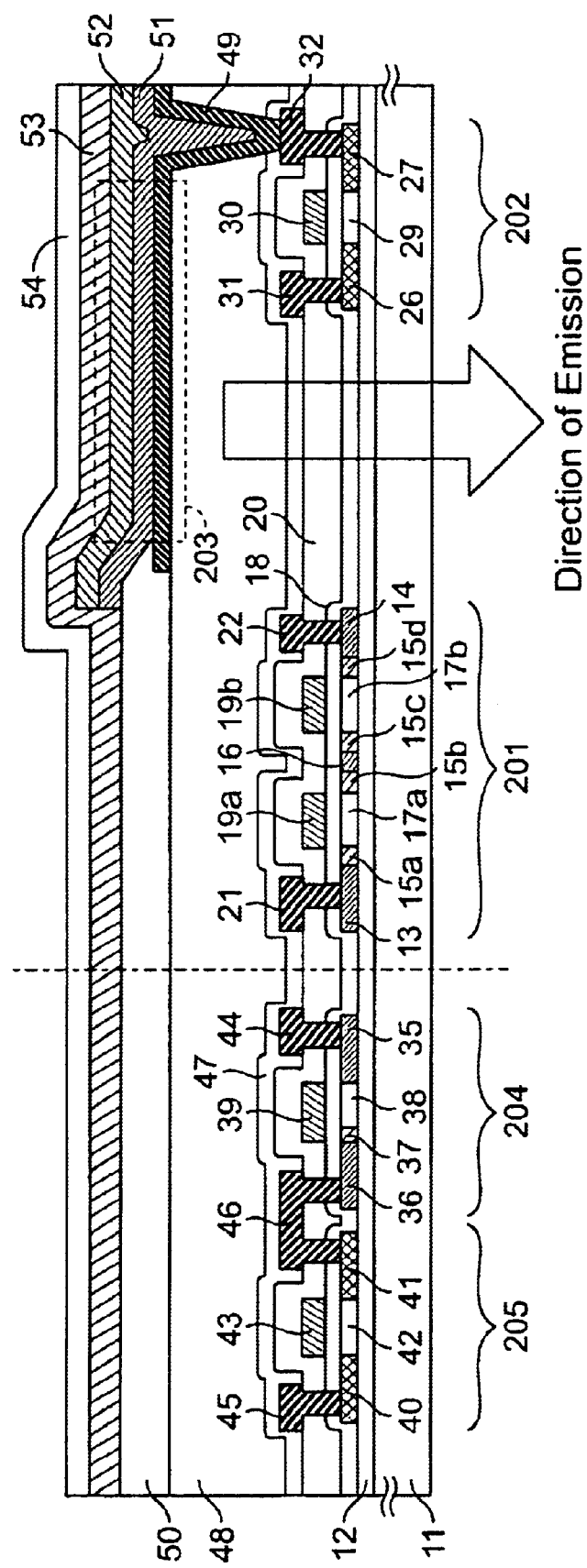
FIG. 2 is a diagram showing in section the structure of the self-luminous device.

Next, FIG. 2 schematically shows in section the structure of the active matrix self-luminous device according to the present invention.

In FIG. 2, reference symbols 11 and 12 denote a substrate and an insulating film serving as a base (hereinafter referred to as base film), respectively. The substrate 11 is a transparent substrate, and typical examples of a transparent substrate usable as the substrate 11 include a glass substrate, a quartz substrate, a glass ceramic substrate and a crystalline glass substrate. However, the material for the substrate has to be resistant to heat of the highest process temperature in the manufacturing process.

The base film 12 is effective especially when using a substrate containing moving ions or a substrate having conductivity. The base film 12 is not necessary for a quartz substrate. An insulating film containing silicon can be used as the base film 12. The term "insulating film containing silicon" herein refers to an insulating film containing oxygen or nitrogen, or both, in a given proportion to silicon. Specific examples thereof include a silicon oxide film, silicon nitride film, and a silicon oxynitride film (expressed as SiOxNy, where x and y are arbitrary integers).

Reference symbol 201 denotes a switching TFT that is an n-channel TFT. However, the switching TFT may be a p-channel TFT. Denoted by reference symbol 202 is a current controlling TFT, and FIG. 2 shows the case where the current controlling TFT 202 is a p-channel TFT. To elaborate, a gate electrode of the current controlling TFT is connected to an anode of an EL element in this case. If an n-channel TFT is used as the current controlling TFT on the other hand, the gate electrode thereof is connected to a cathode of the EL element.

An n-channel TFT has a field effect mobility higher than that of a p-channel TFT, and hence operates at high-speed and is easy for a large amount of current to flow. Moreover, an n-channel TFT is smaller in size than a p-channel TFT when amounts of current flowing in the two are the same.

However, note that it is not necessary to limit the switching TFT and the current controlling TFT of the present invention to n-channel TFTs, but both or one of them may be a p-channel TFT.

The switching TFT 201 is formed to have: an active layer including a source region 13, a drain region 14, LDD regions 15a to 15d, a separate region 16, and channel forming regions 17a and 17b; gate insulating films 18; gate electrodes 19a and 19b; a first interlayer insulating film 20; a source wiring 21; and a drain wiring 22. The gate insulating films 18 or the first interlayer insulating film 20 may be common to all TFTs on the substrate, or different insulating films or first interlayer insulating films may be provided for different circuits or elements.

The switching TFT shown in FIG. 2 has the gate electrodes 19a and 19b that are electrically connected, and thus forms a so-called double gate structure. Needless to say, the switching TFT 201 of FIG. 2 may not always take the double gate structure, namely, it may have the triple gate structure or other multi-gate structure (meaning a structure that has an active layer with two or more channel forming regions serially connected to each other).

The multi-gate structure is very effective in reducing OFF current. If the OFF current of the switching TFT is lowered enough, the capacitance necessary for the capacitor 112 shown in FIG. 1B can be reduced that much. In other words, the area occupied by the capacitor 112 can be diminished. Therefore giving the multi-gate structure to the switching TFT is also effective in increasing the effective light emission area of the EL element 109.

In the switching TFT 201, the LDD regions 15a to 15d are arranged so as not to overlap with the gate electrodes 19a and 19b through the gate insulating films 18. Such structure is very effectual in reducing OFF current. An appropriate length (width) for each of the LDD regions 15a to 15d is 2.0 to 12.0 μm, typically 6.0 to 10.0 μm.

It is even more desirable in reducing OFF current to provide an offset region (which is formed of a semiconductor layer having the same composition as the channel forming region and to which the gate voltage is not applied) at each boundary between the channel forming region and the LDD region. In the case of the multi-gate structure having two or more gate electrodes, the separation region 16

(a region doped with the same amount of the same impurity element as the source region or the drain region) is effective in reducing OFF current.

The current controlling TFT 202 is formed to have a source region 26, a drain region 27, a channel forming region 29, a gate insulating film 18, a gate electrode 30, the first interlayer insulating film 20, a source wiring 31, and a drain wiring 32. Although the gate electrode 30 has the single gate structure, it may take the multi-gate structure.

As shown in FIG. 1B, the drain region of the switching TFT is connected to the gate of the current controlling TFT. Specifically, the gate electrode 30 of the current controlling TFT 202 is electrically connected to the drain region 14 of the switching TFT 201 through the drain wiring (may also be deemed as a connection wiring) 22. The source wiring 29 is connected to the power supply line 110 of FIG. 1B.

From the standpoint of increasing the amount of current allowed to flow in the current controlling TFT 202, forming an active layer of the TFT 202 (the channel forming region, in particular) thick (desirably 50 to 100 nm, more desirably 60 to 80 nm) is an effectual way. On the other hand, from the standpoint of reducing OFF current of the switching TFT 201, it is effective to form the active layer (especially the channel forming regions) of the TFT 201 thin (desirably 20 to 50 nm, more desirably 25 to 40 nm).

The above descriptions are of the structure of the TFTs provided in a pixel. While the TFTs are formed, the driver circuits are simultaneously formed. A CMOS circuit, a basic unit for the driver circuits, can be found in FIG. 2.

In FIG. 2, used as an n-channel TFT 204 of the CMOS circuit is a TFT structured so as to reduce hot carrier injection while avoiding decline in operation speed as much as possible. The driver circuits here refer to the data signal side driver circuit 102 and the gate signal side driver circuits 103 shown in FIGS. 1A and 1B. Of course other logic circuits (such as a level shifter, an A/D converter, and a signal divider circuit) can also be formed.

An active layer of the n-channel TFT 204 includes a source region 35, a drain region 36, an LDD region 37, and a channel forming region 38. The LDD region 37 overlaps with a gate electrode 39 through a gate insulating film 18. The LDD region 37 is also called a Lov region herein.

The LDD region is formed only on the drain region side to avoid drop in operation speed. In the n-channel TFT 204, there is no need to care about reducing OFF current much, but rather to pay attention to the operation speed is important. Accordingly, it is desirable to place the LDD region 37 such that it completely overlaps with the gate electrode to thereby decrease resistive components as much as possible. In short, an offset region is better to be non-existent in this TFT.

In a p-channel TFT 205 of the CMOS circuit, degradation by hot carrier injection is negligible and thus an LDD region is not particularly needed. An active layer thereof accordingly includes a source region 40, a drain region 41, and a channel forming region 42. A gate insulating film 18 is formed thereon and a gate electrode 43 is formed on the film 18. Needless to say, the p-channel TFT 205 may be provided with an LDD region similar to the N-channel TFT 204 as countermeasure against hot carriers.

Both of the n-channel TFT 204 and p-channel TFT 205 are covered with the first interlayer insulating film 20, and source wirings 44 and 45 are formed on the film. The n-channel TFT 204 and p-channel TFT 205 are electrically connected to each other by a drain wiring 46.

Reference symbol 48 denotes a second interlayer insulating film, which has a function of a leveling film for leveling a level difference caused by the TFTs. A preferred material for the second interlayer insulating film 48 is an organic resin film, such as a polyimide film, a polyamide film, an acrylic film, or a BCB (benzocyclobutene) film. These organic resin films are advantageous in that they are easy to form a very flat surface and relative dielectric constant thereof is low. An EL layer is extremely sensitive to unevenness, and the level difference caused by the TFTs is desired to be absorbed almost completely by the second interlayer insulating film. In order to reduce a parasitic capacitance formed between the gate wiring or the data wiring and the cathode of the EL element also, the second interlayer insulating film is desirably formed thick from a material having a low relative dielectric constant. An appropriate thickness thereof is 0.5 to 5 $\mu$m (preferably 1.5 to 2.5 $\mu$m).

Reference symbol 49 denotes a pixel electrode (an anode of the EL element) formed of a conductive oxide film. The pixel electrode 49 is formed such that it is connected to the drain wiring 32 of the current controlling TFT 202 in a contact hole (opening) formed in the second interlayer insulating film 48. Then insulating film 50 is formed. The insulating film 50 is formed by patterning an insulating film containing silicon or an organic resin film. The insulating film 50 is formed to fill a gap between the pixel electrodes in order to prevent an organic EL material used for a light emitting layer and the like to be formed later from covering the end of the pixel electrode 49.

An EL layer 51 is formed on the insulating film 50. The EL layer 51 may take either a single layer structure or a laminate structure. When formed into a laminate structure, the EL layer can provide better light emission efficiency. In general, the EL layer is formed by forming on the pixel electrode a hole injection layer, a hole transportation layer, a light emitting layer, and an electron transportation layer in this order. The EL layer may instead take a laminate structure of a hole transportation layer, a light emitting layer, and an electron transportation layer formed in this order, or a laminate structure of a hole injection layer, a hole transportation layer, a light emitting layer, an electron transportation layer, and an electron injection layer formed in this order. Any known structure may be used for the EL layer of the present invention, and it may be doped with a fluorescent pigment or the like.

For example, organic EL materials disclosed in the following U.S. patents and Japanese Unexamined Patent Publications can be used for the EL layer: U.S. Pat. Nos. 4,356,429, 4,539,507, 4,720,432, 4,769,292, 4,885,211, 4,950,950, 5,059,861, 5,047,687, 5,073,446, 5,059,862, 5,061,617, 5,151,629, 5,294,869, and 5,294,870, and Japanese Patent Application Laid-open Nos. Hei 10-189525, Hei 8-241048, and Hei 8-78159.

Color display methods for a self-luminous device are roughly classified into four types, one type including forming three kinds of EL elements each corresponding to one of R (red), G (green), and B (blue), one type including a combination of an EL element emitting white light and color filters, one type including a combination of an EL element emitting blue or bluish green light and a fluorescent substance (fluorescent color conversion layer: CCM), and one type including the use of a transparent electrode as a cathode (opposite electrode) and overlapping it with EL elements each corresponding to one of R, G, and B.

A cathode 52 of the EL element is formed on the EL layer 51. A material containing one of magnesium (Mg), lithium (Li), and calcium (Ca), which are low in work function, is used as the cathode 52. An electrode made of MgAg (a material containing Mg and Ag with a ratio of Mg to Ag being 10 to 1) is preferable. An MgAgAl electrode, an LiAl electrode, and an LiFAl electrode can be given as examples of other preferable cathode materials.

The EL layer 51 and the cathode 52 are desirably formed successively without exposing them to the air. This is because the condition of the interface between the cathode 52 and the EL layer 51 greatly influences the light emission efficiency of the EL element. The EL element herein refers to a light emitting element composed of a pixel electrode (anode), an EL layer, and a cathode.

A laminate consisting of the EL layer 51 and the cathode 52 has to be formed separately for each pixel. Unfortunately, the normally used photolithography technique cannot be used here because the EL layer is extremely weak against moisture. Therefore the laminate is selectively formed by vacuum evaporation, sputtering, plasma CVD, or the like while using a physical mask such as a metal mask.

Although it is not impossible to selectively form the EL layer by the ink jet method, screen printing, or like other methods, the EL layer and the cathode cannot be formed successively with these methods under the present circumstances. Thus the methods given in the above paragraph are preferred.

Reference symbol 53 denotes a protective electrode, which is to protect the cathode 52 from the external moisture or the like and to connect the cathode 52 of each pixel with another cathode 52 as well. A preferable material for the protective electrode 53 is a low resistive material containing aluminum (Al), copper (Cu), or silver (Ag). The protective electrode 53 expectedly provides a heat releasing effect to alleviate heat generated from the EL layer. It is also effective to form the EL layer 51, the cathode 52, and the protective film 53 successively without exposing them to the air.

The present invention is to provide an active matrix self-luminous device improved in terms of influence of the TFT fluctuation which has conventionally been the problem in analog-driven gray scale display, the improvement being made by employing digital-driven time division gray scale display. Accordingly, the present invention is not limited to the structure of the self-luminous display device shown in FIG. 2. The structure illustrated in FIG. 2 is merely one of preferred modes for carrying out the present invention.

The above TFT formed of a polysilicon film operates at high speed and, for that very reason, is likely to suffer from degradations such as the one caused by hot carrier injection. Therefore to arrange in the same pixel different TFTs that are different in structure (combination of a switching TFT with sufficiently low Off current and a current controlling TFT resistant against hot carrier injection) in accordance with different functions as shown in FIG. 2, is very effectual in manufacturing a self-luminous device that demonstrates high reliability and is capable of excellent image display (high operation performance).

Figure 19A:
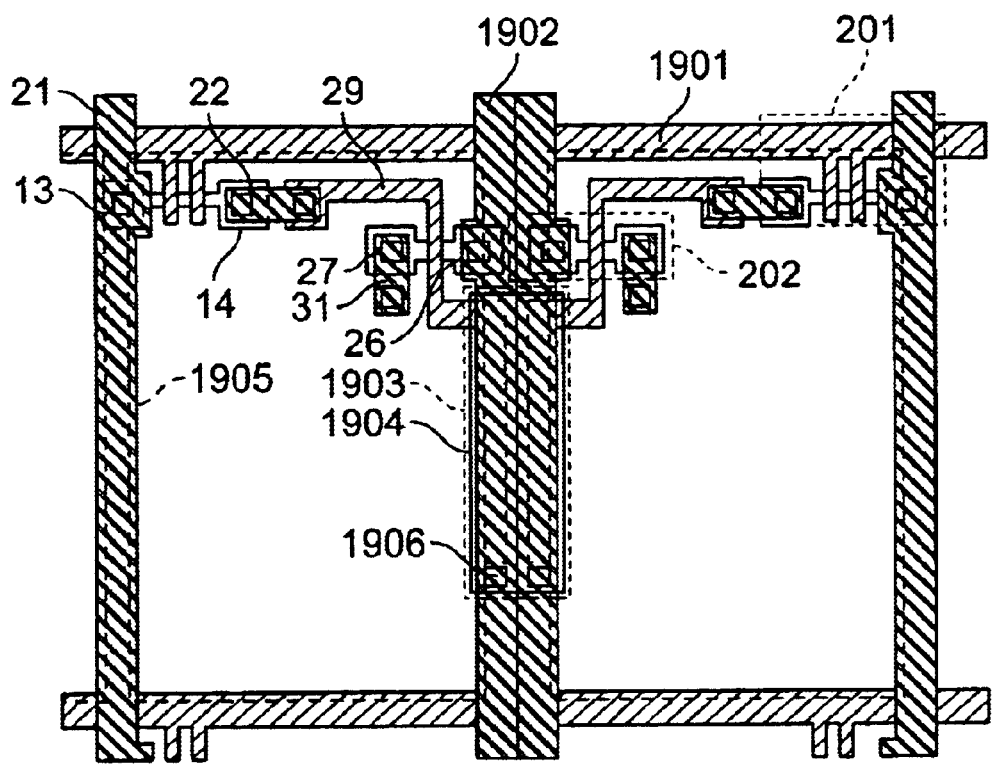
FIGS. 19A and 19B are diagrams showing the top structure of a pixel portion of the self-luminous device.
Figure 19B:
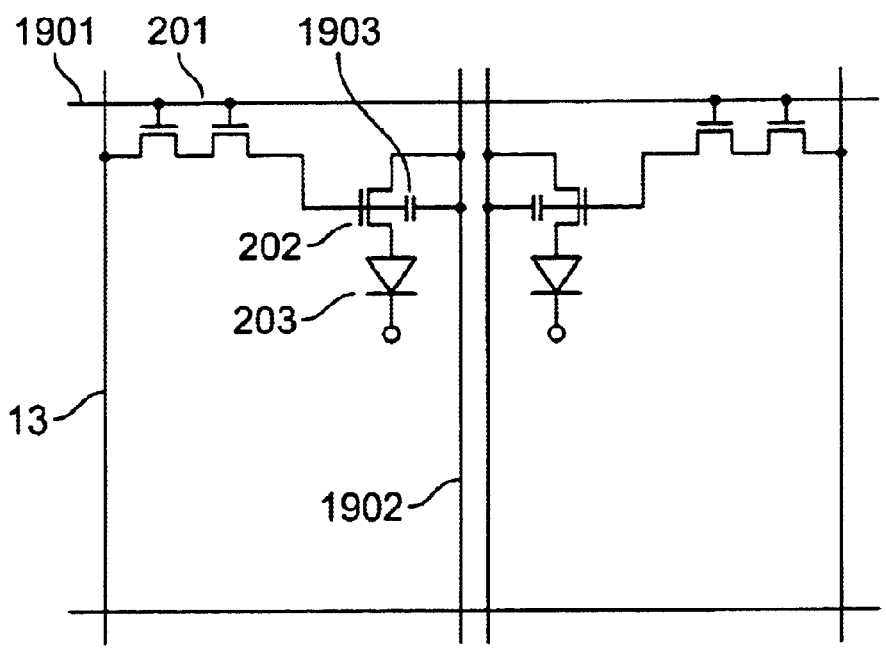

In the self-luminous device of the present invention, each pixel has a storage capacitor. FIGS. 19A and 19B shows a capacitor to be formed in the case of giving the present invention the structure shown in FIG. 2. In FIGS. 19A and 19B, components corresponding to those in FIGS. 1A and 1B and in FIG. 2 are denoted by the reference symbols of FIGS. 1A to 2.

A region denoted by 1903 in FIGS. 19A and 19B serves as the storage capacitor. The storage capacitor 1903 is formed among a semiconductor film 1904 electrically connected to a power supply line 1902, an insulating film (not shown) formed of the same layer as the gate insulating film, and the gate electrode 29. The semiconductor film 1904 is separate from the semiconductor film for forming the switching TFT and the current controlling TFT, and hence is called herein a separate semiconductor film. Specifically, the separate semiconductor film 1904 is isolated of the active layer for forming the source region 13 of the switching TFT and the drain region 14 thereof and the source region 26 of the current controlling TFT and the drain region 27 thereof, as can be seen in FIG. 19A. In the region denoted by 1903, the separate semiconductor film 1904 overlaps with the gate electrode 29 with the gate insulating film sandwiched therebetween. The portion that overlaps with the gate electrode 29 at this point occupies 60% or more of the entire separate semiconductor film 1904. The 60% or more of the separate semiconductor film 1904 further overlaps with the power supply line 1902 with the first interlayer insulating film sandwiched therebetween. A capacitor formed from the gate electrode 29, the same layer (not shown) as the first interlayer insulating film, and the power supply line 1902 can also be used as the storage capacitor.

[Embodiment 1]

Embodiments of the present invention will be described with reference to FIGS. 9 to 16 and Tables 1 to 4. Descriptions here are about: a pixel portion used in carrying out the present invention; the structure and specifications (size, voltage values, etc.) of driver circuits provided in the periphery of the pixel portion; and signals to be inputted thereto.

Figure 9:
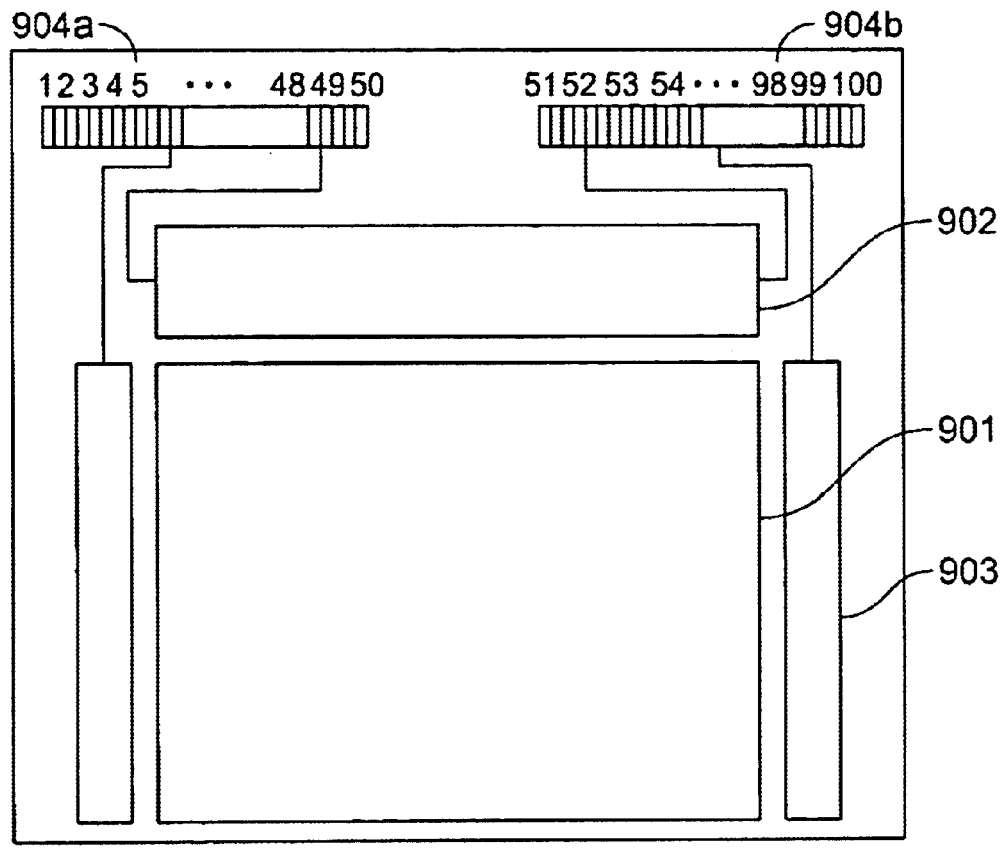
FIG. 9 is a top view of the entire panel of the self-luminous device.

FIG. 9 is a plan view of the entire panel showing its top (the side of the panel on which a cathode is to be formed). Accordingly, the side for display is the bottom in FIG. 9. Reference symbol 901 in FIG. 9 denotes a pixel portion, 902, a source driver circuit, 903, gate driver circuits, and 904, flexible printed circuit (hereinafter abbreviated as FPC) input portions. The FPC used in this embodiment is 500 $\mu$m in pitch and has 50×2 terminals.

Figure 10:
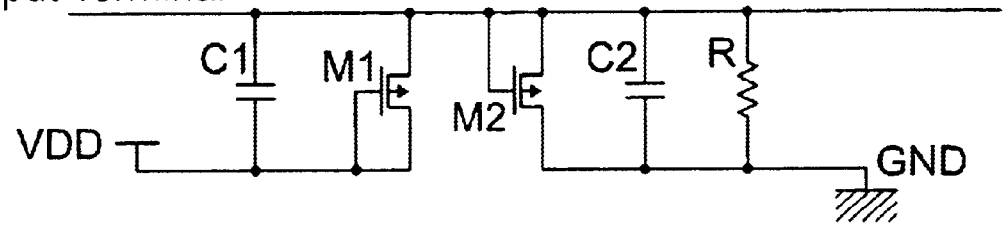
FIG. 10 is a diagram showing protective circuits of FPC input portions.

In this embodiment, a protective circuit for an FPC input portion as the one shown in FIG. 10 is provided in some of FPC input portions (1) 904a and FPC input portions (2) 904b of FIG. 9. Out of the FPC input portions (1) 904a and the FPC input portions (2) 904b numbered 1 to 100 (above the respective input portions in FIG. 9), the input portions 1 to 19 and 82 to 100 do not have the protective circuit for an FPC input portion.

Specifications of the FPC input terminals used in this embodiment are shown in Table 1. Note that the "terminal Nos." in Table 1 correspond to the numbers (1 to 100) above the FPC input portions (1) 904a and the FPC input portions (2) 904b in FIG. 9.

TABLE 1

| terminal No. | symbol of treminal | voltage (range) [V] | remarks (name of signal etc.) pad (dummy terminal) |
|---|---|---|---|
| 1 | EL_CATH | approximately 4 (0.0 ~ 9.0)/9 | EL driving direct current power supply (positive terminal) |
| 2 | EL_ANOD | 9 | EL driving direct current power supply (negative terminal) |
| 3 | S_LATb | 0.0/9.0 | latch inversion signal of source driver circuit |
| 4 | S_LAT | 0.0/9.0 | latch signal of source driver circuit |
| 5 | VD_16 | 0.0/9.0 | digital video signal 16 |
| 6 | VD_15 | 0.0/9.0 | digital video signal 15 |
| 7 | VD_14 | 0.0/9.0 | digital video signal 14 |
| 8 | VD_13 | 0.0/9.0 | digital video signal 13 |
| 9 | VD_12 | 0.0/9.0 | digital video signal 12 |
| 10 | VD_11 | 0.0/9.0 | digital video signal 11 |
| 11 | VD_10 | 0.0/9.0 | digital video signal 10 |
| 12 | VD_09 | 0.0/9.0 | digital video signal 9 |
| 13 | VD_08 | 0.0/9.0 | digital video signal 8 |
| 14 | VD_07 | 0.0/9.0 | digital video signal 7 |
| 15 | VD_06 | 0.0/9.0 | digital video signal 6 |
| 16 | VD_05 | 0.0/9.0 | digital video signal 5 |
| 17 | VD_04 | 0.0/9.0 | digital video signal 4 |
| 18 | VD_03 | 0.0/9.0 | digital video signal 3 |
| 19 | VD_02 | 0.0/9.0 | digital video signal 2 |
| 20 | VD_01 | 0.0/9.0 | digital video signal 1 |
| 21 | S_GND | 0 | negative power supply of source driver circuit |
| 22 | S_VDD | 9 | positive power supply of source driver circuit |
| 23 | S_LEFT | 0.0 or 9.0 | switching of scanning direction of source driver circuit (0.0 scanning to the right, 9.0:scanning to the left) |
| 24 | S_SP | 0.0/9.0 | start pulse of source driver circuit |
| 25 | S_CKb | 0.0/9.0 | inverted clock signal of source driver circuit |
| 26 | S_CK | 0.0/9.0 | clock signal of source driver circuit |
| 27 | VD_01 | 0.0/9.0 | digital video signal 1 |
| 28 | VD_02 | 0.0/9.0 | digital video signal 2 |
| 29 | VD_03 | 0.0/9.0 | digital video signal 3 |
| 30 | VD_04 | 0.0/9.0 | digital video signal 4 |
| 31 | VD_05 | 0.0/9.0 | digital video signal 5 |
| 32 | VD_06 | 0.0/9.0 | digital video signal 6 |
| 33 | VD_07 | 0.0/9.0 | digital video signal 7 |
| 34 | VD_08 | 0.0/9.0 | digital video signal 8 |
| 35 | VD_09 | 0.0/9.0 | digital video signal 9 |
| 36 | VD_10 | 0.0/9.0 | digital video signal 10 |
| 37 | VD_11 | 0.0/9.0 | digital video signal 11 |
| 38 | VD_12 | 0.0/9.0 | digital video signal 12 |
| 39 | VD_13 | 0.0/9.0 | digital video signal 13 |
| 40 | VD_14 | 0.0/9.0 | digital video signal 14 |
| 41 | VD_15 | 0.0/9.0 | digital video signal 15 |
| 42 | VD_16 | 0.0/9.0 | digital video signal 16 |
| 43 | G_GND | 0 | negative power supply of gate driver circuit |
| 44 | G_VDD | 10 | positive power supply of gate driver circuit |
| 45 | G_UP | 0.0 or 10.0 | switching of scanning direction of gate driver circuit (0.0:scanning to the right, 9.0:scanning to the left) |
| 46 | G_CKb | 0.0/10.0 | inverted clock signal of gate driver circuit |
| 47 | G_CK | 0.0/10.0 | clock signal of gate driver |
| 48 | G_SP | 0.0/10.0 | start pulse of gate driver circuit |
| 49 | EL_ANOD | 9 | EL driving direct current power supply (positive terminal) |
| 50 | EL_CATH | approximately 4 (0.0 ~ 9.0)/9 | EL driving direct current power supply (negative terminal) pad (dummy terminal) |

Figure 11:
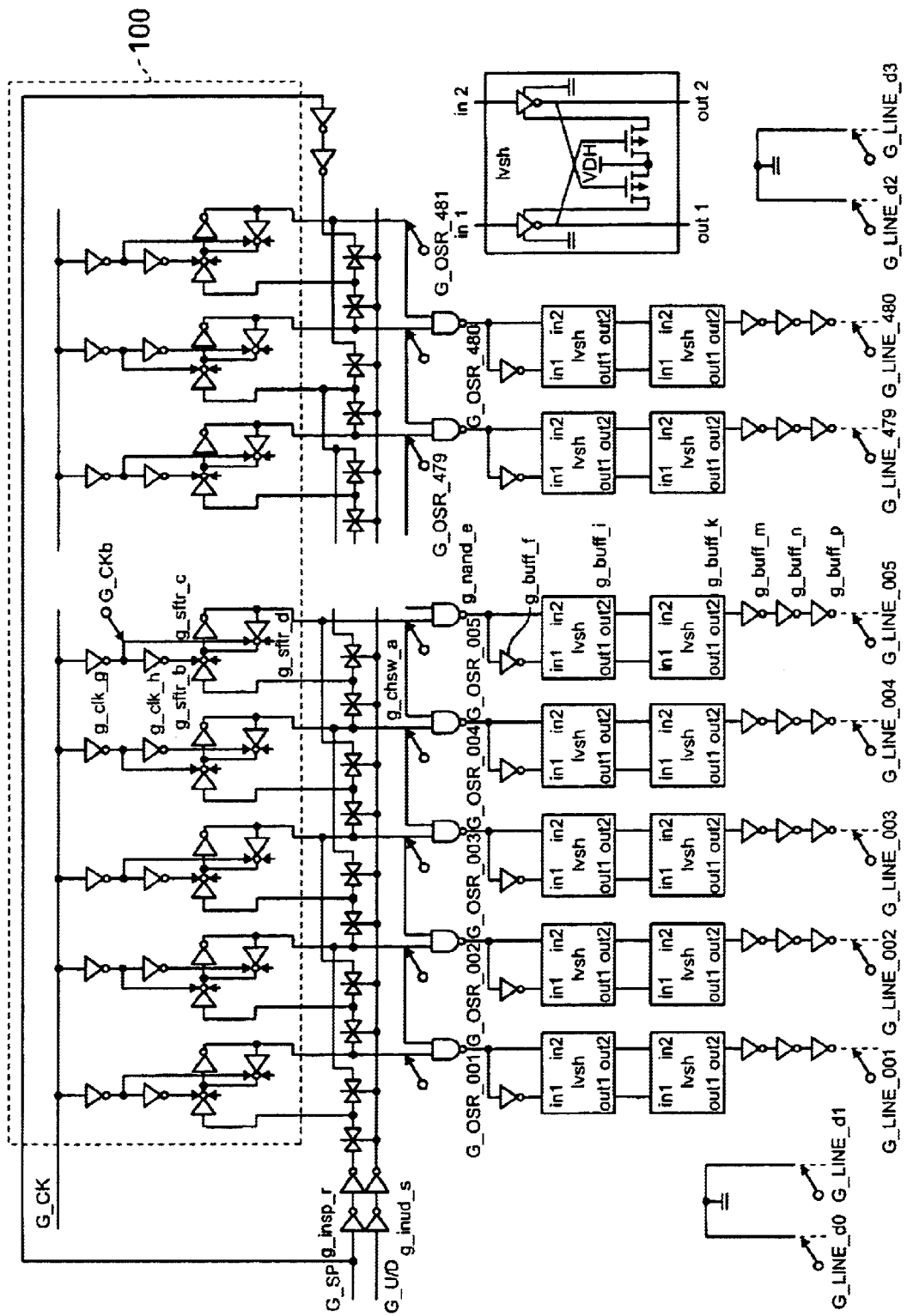
FIG. 11 is a diagram showing a gate driver circuit of the self-luminous device.

Next, FIG. 11 shows a detailed circuit diagram of the gate driver circuits 103 of FIG. 9. In the gate driver circuits, the positive power supply voltage is 10 V, the negative power supply voltage is 0 V, and the frequency of an operating clock inputted to the gate driver circuits is 250 kHz. These driver circuits have a function of switching the scanning direction.

In FIG. 11, reference symbol g_chsw_a represents a scanning direction changing switch; g_sftr_b, g_sftrc and gfstr_d each represent a part of a shift register; g_nand_e represents a NAND circuit; and g_buff_f, g_buff_i, g_buff_k, g_buff_m, g_buff_n, and g_buff_p represent buffers. g_clk_g and g_clk_h represent clock circuits.

In this embodiment, a portion enclosed by the broken line in FIG. 11, that is, a portion consisting of g_sftr_b, g_sftr_c, g_sftr_d, g_clk_g, and g_clk_h serves as a shift register (11001).

Table 2 shows the size of TFTs included in the shift register, the NAND circuits, and the buffers which constitute the gate driver circuits of this embodiment. The shift register, the NAND circuits, and the buffers use p-channel TFTs and n-channel TFTs, and both of them are shown in Table 2. The symbols in Table 2 correspond to reference symbols of FIG. 11. L[$\mu$m] in Table 2 represents the channel length of the TFT whereas W[$\mu$m] represents the channel width of the TFT.

TABLE 2

| Pch-TFT | L[μm] | W[μm] | Nch-TFT | L[μm] | Lov[μm] | W[μm] |
|---|---|---|---|---|---|---|
| g_chsw_a | 4.5 | 20 | g_chsw_a | 5 | 0.5 | 10 |
| g_sftr_b | 4.5 | 16 | g_sftr_b | 5 | 0.5 | 8 |
| g_sftr_c | 4.5 | 40 | g_sftr_c | 5 | 0.5 | 20 |
| g_sftr_d | 4.5 | 10 | g_sftr_d | 5 | 0.5 | 5 |
| g_nand_e | 4.5 | 22 | g_nand_e | 5 | 0.5 | 22 |
| g_buff_f | 4.5 | 50 | g_buff_f | 5 | 0.5 | 25 |

Figure 12:
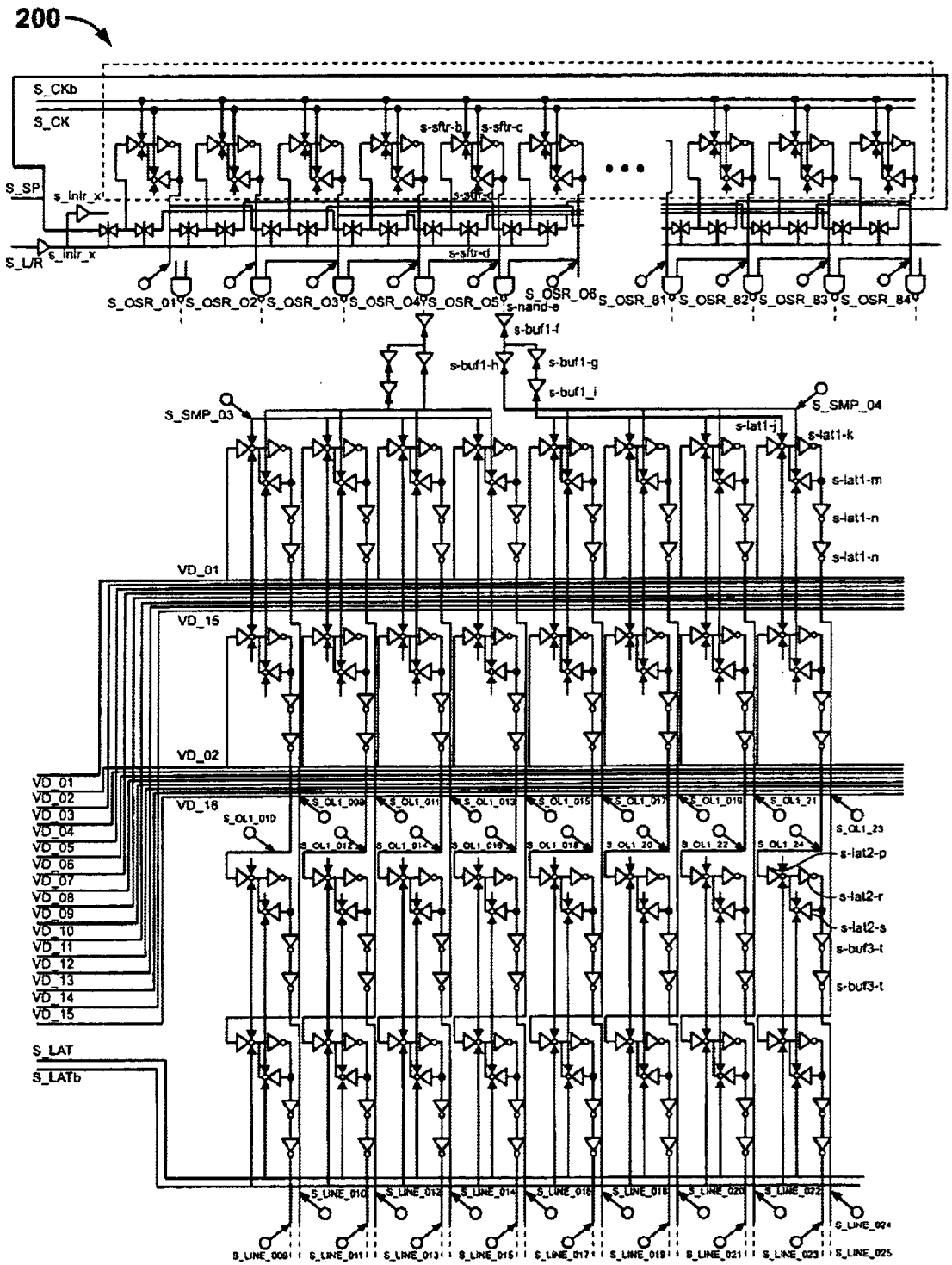
FIG. 12 is a diagram showing a source driver circuit of the self-luminous device.

Shown next in FIG. 12 is a detailed circuit diagram of the source driver circuit 902 of FIG. 9. In the source driver circuit, the positive power supply voltage is 9 V, the negative power supply voltage is 0 V, and the frequency of an operating clock inputted to the source driver circuit is 12.5 MHz. The source driver circuit has a function of switching the scanning direction.

In FIG. 12, reference symbol s_chsw_a represents a scanning direction changing switch; s_sftr_b, s_sftr_c and s_fstr_d each represent a part of a shift register; s_nand_e represents a NAND circuit; and s_buf1_f, s_buf1_g, s_buf1_h, s_buf1_i, s_buf2_n, and s_buf3_t represent buffers. s_lat1_j, s_lat1_k, and s_lat1_m each represent a first stage latch (hereinafter referred to as latch 1), and s_lat2_p, s_lat2_r, and s_lat2_s each represent a second stage latch (hereinafter referred to as latch 2).

In this embodiment, a portion enclosed by the broken line in FIG. 12, that is, a portion consisting of s_sftr_b, s_sftr_c, and s_sftr_d serves as a shift register (12001).

Table 3 shows the size of TFTs included in the shift register, the NAND circuits, and the buffers which constitute the source driver circuit of this embodiment. The shift register, the NAND circuits, and the buffers use p-channel TFTs and n-channel TFTs, and both of them are shown in Table 3. The symbols in Table 3 correspond to the reference symbols of FIG. 12. L[μm] in Table 3 represents the channel length of the TFT whereas W[μm] represents the channel width of the TFT. The channel length of the n-channel TFT includes an LOV region.

The area of the auxiliary capacitor 704 is S~0.008×0.036 mm² (among LDDSi-Gta-Al).

Specifications of the display panel according to this embodiment are shown in Table 4.

TABLE 4

| size of screen | diagonal 4.0 inches |
|---|---|
| number of pixels | 640 × 480 |
| interval of pixels | 126 μm |
| grey scales | 64 (6 bit) |
| aperture ratio | 60% |
| operating clock frequency of source driver circuit | 12.5 MHz |
| operating clock frequency of gate driver circuit | 252 kHz |
| voltage of driver circuit | 12 V |
| voltage of display region | 6 V |
| duty ratio | 61.5% |
| color | monochrome |

In this embodiment, the panel size is 87 mm×100 mm and the screen size is 61 mm×81 mm (diagonal size: 4.0 inch). The pixel pitch is 126 μm, and the pixels are arranged to form stripes. The aperture ratio is about 60%.

In this embodiment, the pixel portion can be classified into regions where light transmission is hindered by TFTs and wirings and regions corresponding to the rest of the pixel portion, the latter being called transmission regions. The ratio of the total area of the transmission regions to the area of the entire pixel portion is referred to as aperture ratio (or effective light emission area). The number of pixels

TABLE 3

| Pch-TFT | L[μm] | W[μm] | Nch-TFT | L[μm] | Lov[μm] | W[μm] |
|---|---|---|---|---|---|---|
| s_chsw_a | 4.5 | 60 | s_chsw_a | 5 | 0.5 | 40 |
| s_sftr_b | 4.5 | 50 | s_sftr_b | 5 | 0.5 | 25 |
| s_sftr_c | 4.5 | 100 | s_sftr_c | 5 | 0.5 | 50 |
| s_sftr_d | 4.5 | 30 | s_sftr_d | 5 | 0.5 | 15 |
| s_nand_e | 4.5 | 50 | s_nand_e | 5 | 0.5 | 50 |
| s_buf1_f | 4.5 | 100 | s_buf1_f | 5 | 0.5 | 50 |
| s_buf1_g | 4.5 | 100 | s_buf1_g | 5 | 0.5 | 50 |
| s_buf1_h | 4.5 | 300 | s_buf1_h | 5 | 0.5 | 150 |
| s_buf1_i | 4.5 | 400 | s_buf1_i | 5 | 0.5 | 200 |
| s_lat1_j | 4.5 | 16 | s_lat1_j | 5 | 0.5 | 8 |
| s_lat1_k | 4.5 | 16 | s_lat1_k | 5 | 0.5 | 8 |
| s_lat1_m | 4.5 | 4 | s_lat1_l | 5 | 0.5 | 2 |
| s_buf2_n | 4.5 | 30 | s_buf2_n | 5 | 0.5 | 15 |
| s_lat2_p | 4.5 | 16 | s_lat2_p | 5 | 0.5 | 8 |
| s_lat2_r | 4.5 | 16 | s_lat2_r | 5 | 0.5 | 8 |
| s_lat1_s | 4.5 | 4 | s_lat2_s | 5 | 0.5 | 2 |
| s_buf3_t | 4.5 | 30 | s_buf3_t | 5 | 0.5 | 15 |

Figure 7:
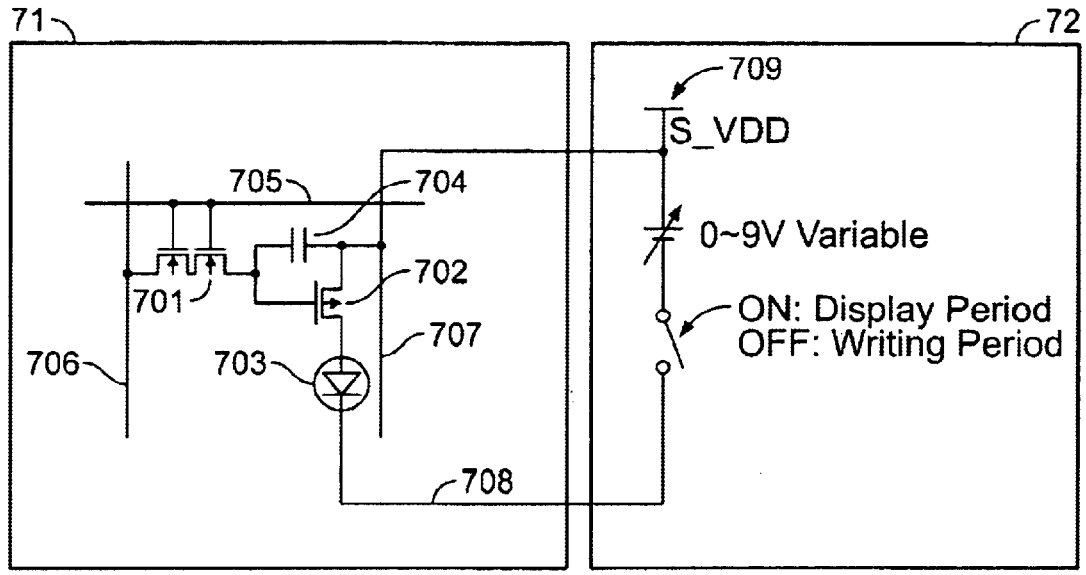
FIG. 7 is a diagram showing a pixel structure in a pixel portion of the self-luminous device.
Figure 8:
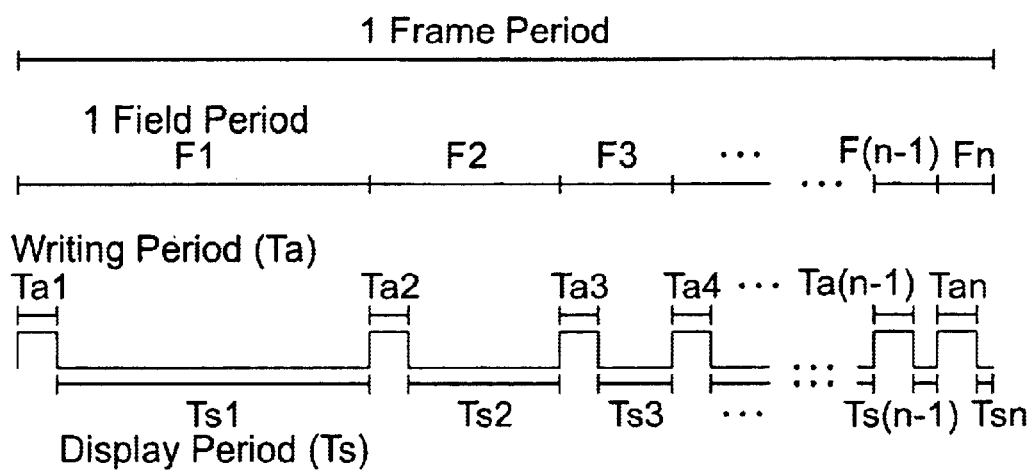
FIG. 8 is a diagram showing an operation mode of the time division gray scale method.

Each pixel in the panel according to this embodiment takes the structure of the pixel (71) shown in FIG. 7. Here, the current controlling TFT 702 is a p-channel TFT (L=5.0 μm, W=15.0 μm), and the switching TFT 701 is an n-channel TFT (L=4.0 μm (excluding Loff=2.0 μm×2×2), W=3 μm).

contained in one screen is calculated from (d2+640+d2)× (d2+480+d2), namely, 307200+(d) 4496 pixels, where d represents dummies.

According to the specifications in this embodiment, the panel has the VGA resolutions of 640×480, and displays an image in monochrome. It displays in 64 gray scales (6 bits) and the duty ratio thereof is 62.5%.

The aperture ratio in this embodiment is shown in relation to one panel size. However, the aperture ratio may be 50 to 80% if the pixel pitch is 100 to 140 µm.

[Embodiment 2]

In Embodiment 1, the power source (709 in FIG. 7) for applying voltage to the EL element provided outside the panel is turned off during the display periods whereas the power source is turned on during the writing periods. According to this method, the power source is turned on upon the start of the display period after the writing period, resulting in rapid increase in current flow. It sometimes surpasses the ability of a variable voltage source for charging the load of the entire panel.

As a result, the necessary voltage cannot be applied to the entire panel to make the display quality of the panel unsatisfiable.

In order to prevent the rapid increase in current between the writing period and the display period, the power supply (709 in FIG. 7) is kept on in Embodiment 2.

Figure 5A:
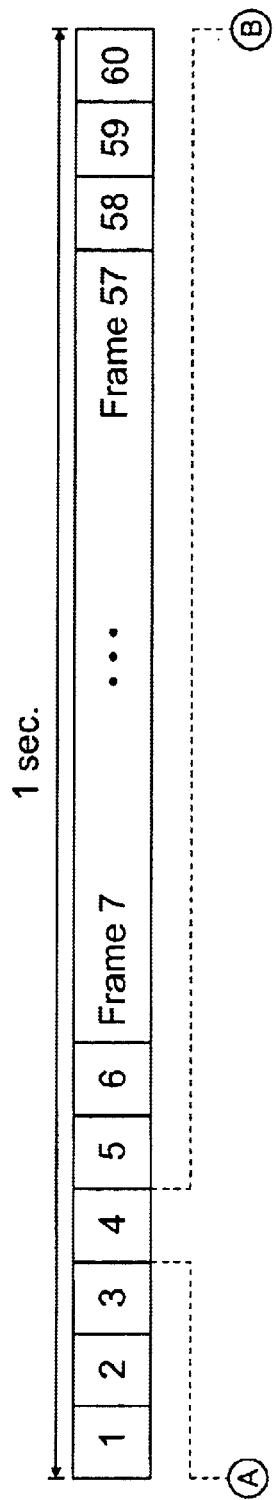
Figure 5B:
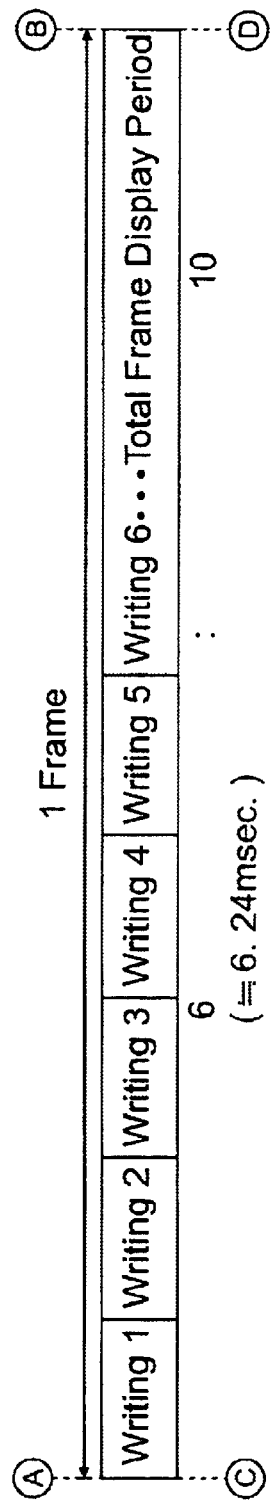
Figure 5C:
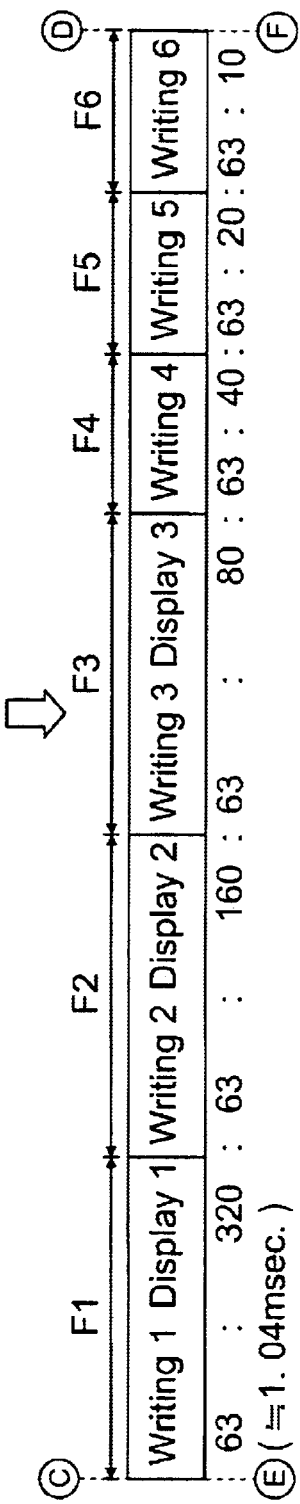
Figure 6:
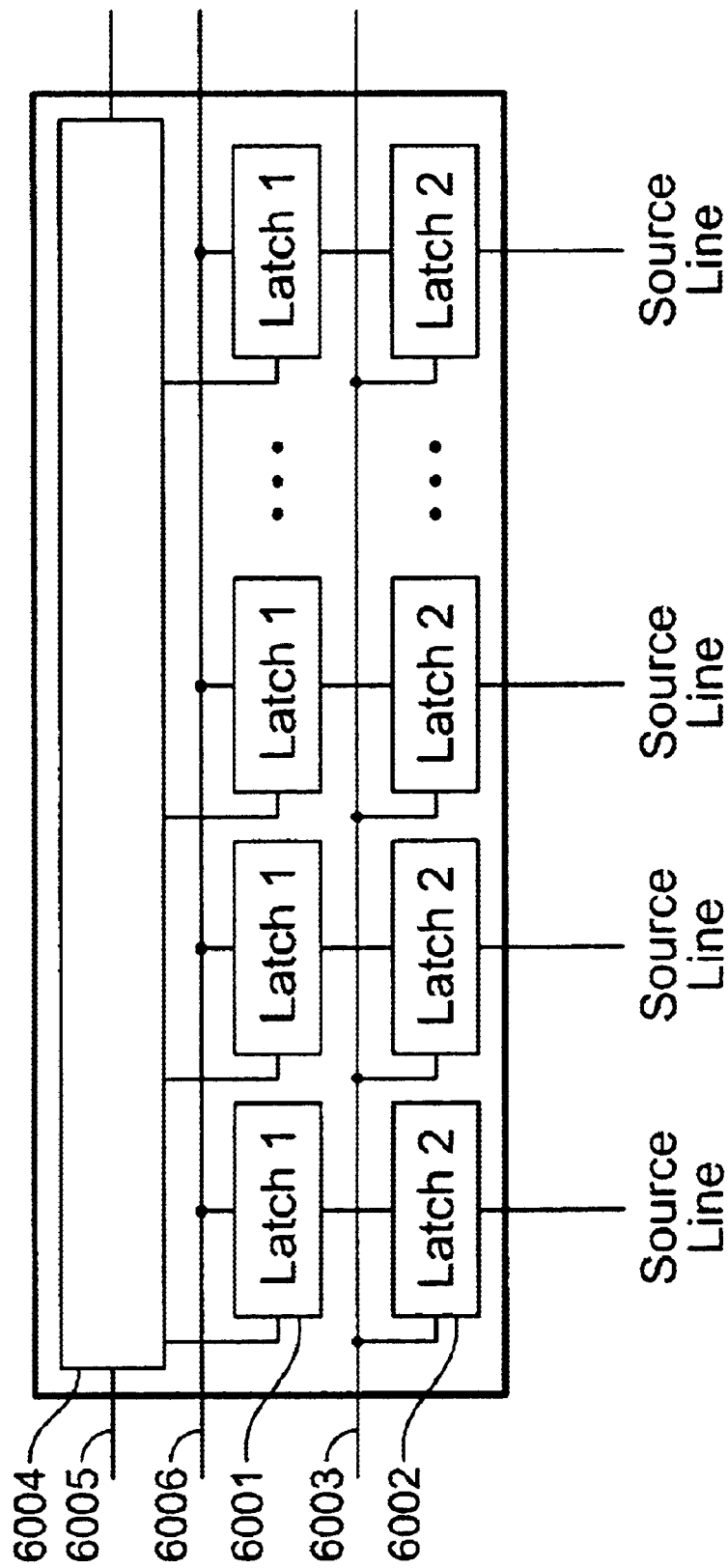
FIG. 6 is a diagram showing a source driver circuit of the self-luminous device.

However, this method leads to all-time display including the writing periods. If the display periods are shorter than the writing periods such as Writing 4, Writing 5, and Writing 6 in FIG. 5C, Display 4, Display 5, and Display 6 are assimilated into the writing periods and cannot be distinguished.

In other words, carrying out this embodiment requires considering (1) to shorten the writing periods by decreasing the number of pixels, (2) to increase the operation speed by improving the ability of the TFTs included in the driver circuits, and (3) to increase the operation speed by installing the driver circuits outside the panel.

[Embodiment 3]

Embodiment 3 of the present invention will be described with reference to FIGS. 13A to 15C. Given here is a description on a method of manufacturing simultaneously TFTs of a pixel portion and TFTs of driver circuits provided in the periphery of the pixel portion. To simplify the description, a CMOS circuit that is a base unit is shown as the driver circuits.

Figure 13A:
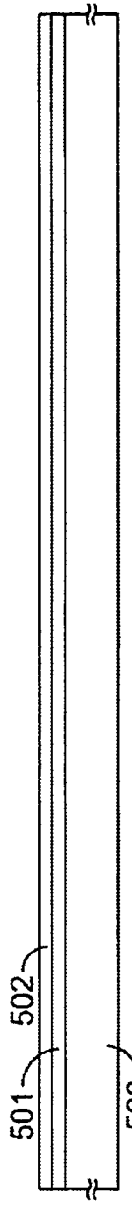
FIGS. 13A to 13E are diagrams showing a process of manufacturing the self-luminous device.

First, as shown in FIG. 13A, a base film 501 is formed to a thickness of 300 nm on a glass substrate 500. In this embodiment, layered silicon oxynitride films are used as the base film 501. At this point, the layer of the base film which comes into contact with the glass substrate 500 contains a 10 to 25 wt % of nitrogen. It is effective to give the base film 501 a heat releasing effect, and a DLC (diamond-like carbon) film may be provided.

Next, an amorphous silicon film with a thickness of 50 nm (not shown) is formed on the base film 501 by a known film deposition method. There is no need to limit this film to an amorphous silicon film and it may be any semiconductor film as long as it contains an amorphous structure (including a microcrystalline semiconductor film). It may instead be a compound semiconductor film containing an amorphous structure, such as an amorphous silicon germanium film. An appropriate film thickness thereof is 20 to 100 nm.

Following the technique disclosed in Japanese Patent Application Laid-open No. Hei 7-130652, the amorphous silicon film is crystallized to form a crystalline silicon film (also called a polycrystalline silicon film) 502. Other known crystallizing methods that are usable are the one using laser light and the one using infrared light. (FIG. 13A)

Figure 13B:
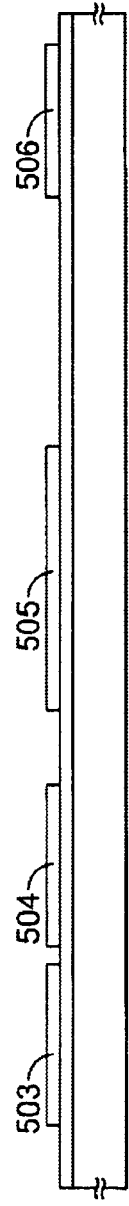

As shown in FIG. 13B, the crystalline silicon film 502 is patterned to form island-like semiconductor films 503 to 506. (FIG. 13B)

A protective film 507 is formed on the crystalline silicon film 502 from a silicon oxide film to a thickness of 130 nm. The thickness of the protective film is appropriate if it is in a range of 100 to 200 nm (preferably 130 to 170 nm). Other films may also be used if they are insulating films containing silicon. The protective film 507 is formed to prevent the crystalline silicon film from being exposed to plasma when impurities are doped, and to control the concentration finely.

Figure 13C:
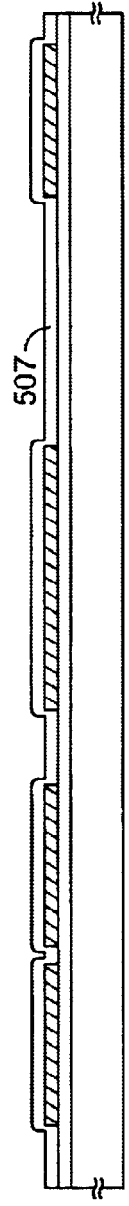

The semiconductor films 503 to 506 are doped with impurity elements for imparting p-type conductivity (hereinafter referred to as p-type impurity elements) through the protective film 507. Examples of the p-type impurity elements include elements belonging to Group 13 of the periodic table, typically, boron. In this embodiment, boron doping is conducted by plasma doping in which diborane ($B_2H_6$) is subjected to plasma excitation without putting it through mass separation. Of course ion implantation involving mass separation may be chosen instead. (FIG. 13C)

Through this doping step, the semiconductor films 503 to 506 obtain the p-type impurity elements in a concentration of $1 \times 10^{15}$ to $1 \times 10^{17}$ atoms/cm$^3$ (typically $1 \times 10^{16}$ to $1 \times 10^{17}$ atoms/cm$^3$). The p-type impurity elements used in the doping here are used to adjust the threshold voltage of the TFTs.

Figure 13D:
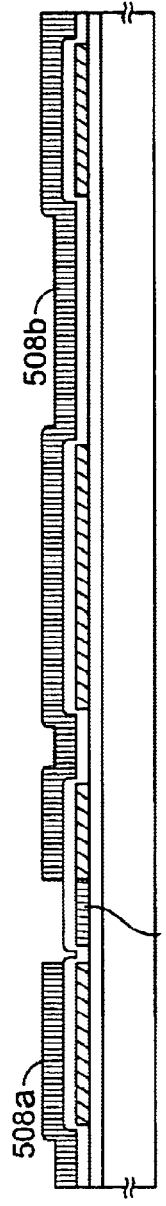

Subsequently resist masks 508a and 508b are formed on the protective film 507. The resist masks 508a and 508b are doped with impurity elements for imparting n-type conductivity (hereinafter referred to as n-type impurity elements) through the protective film 507. Examples of the n-type impurity elements include elements belonging to Group 15 in the periodic table, typically, phosphorus or arsenic. In this embodiment, phosphorus doping is conducted by plasma doping in which phosphine ($PH_3$) is subjected to plasma excitation without putting it through mass separation, so that phosphorus is contained in the films in a concentration of $1 \times 10^{18}$ atoms/cm$^3$. Of course ion implantation involving mass separation may be chosen instead. (FIG. 13D)

The dose is adjusted such that an n-type impurity region 509 formed through this doping step contains the n-type impurity elements in a concentration of $2 \times 10^{16}$ to $5 \times 10^{19}$ atoms/cm$^3$ (typically, $5 \times 10^{17}$ to $5 \times 10^{18}$ atoms/cm$^3$).

The n-type impurity elements and the p-type impurity elements used in the doping may be activated at this point. Known activation methods can be used for activation. Typically, laser annealing, lamp annealing and furnace annealing are used alone or in combination.

Figure 13E:
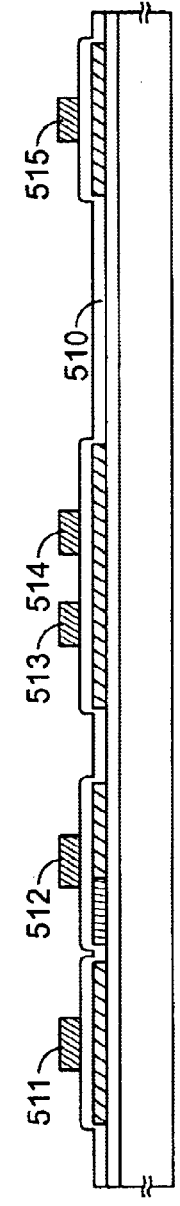

Next, as shown in FIG. 13E, a gate insulating film 510 is formed to cover the semiconductor films 503 to 506. An appropriate material for the gate insulating film 510 is an insulating film containing silicon and having a thickness of 10 to 200 nm, preferably 50 to 150 nm. The gate insulating film may take either a single layer structure or a laminate structure. A silicon oxynitride film with a thickness of 110 nm is used in this embodiment.

A conductive film with a thickness of 200 to 400 nm is then formed and patterned to form gate electrodes 511 to 515. The gate electrodes may be formed of a single layer of conductive film. However, the gate electrodes may be a laminate conductive film having two layers, three layers or more if necessary. Any known conductive film can be used as a material of the gate electrodes.

The conductive films typically used are: a film formed of an element selected from the group consisting of tantalum (Ta), titanium (Ti), molybdenum (Mo), tungsten (W), chromium (Cr), and silicon (Si); a film of nitride of an element selected from the above (exemplified by tantalum nitride film, tungsten nitride film, and titanium nitride film); an alloy film containing a combination of the above elements (exemplified by an Mo-W alloy film and an Mo-Ta alloy film); and a film of silicide of an element selected from the above (exemplified by a tungsten silicide film and a titanium silicide film). These may of course be used either as a single layer or as a laminate.

Used in this embodiment is a laminate film consisting of a tantalum nitride (TaN) film with a thickness of 50 nm and a tantalum (Ta) film with a thickness of 350 nm. The laminate film is formed by sputtering. If sputtering gas is added with inert gas such as Xe and Ne, the film peeling caused by stress can be prevented.

The gate electrode 512 is formed so as to overlap with a part of the n-type impurity region 509 with the gate insulating film sandwiched therebetween. This overlapping portion later forms an LDD region that overlaps with the gate electrode.

As shown in FIG. 14A, doping with n-type impurity elements (phosphorus, in this embodiment) is then performed in a self-aligning manner using the gate electrodes 511 to 515 as masks. Adjustment is made on the dose of phosphorus such that impurity regions 516 to 523 thus formed have phosphorus in a concentration half or one-tenth (typically one-third to one-fourth) the concentration in the n-type impurity region 509. Specifically, preferable concentration is $1 \times 10^{16}$ to $5 \times 10^{18}$ atoms/cm$^3$ (typically, $3 \times 10^{17}$ to $3 \times 10^{18}$ atoms/cm$^3$).

Then as shown in FIG. 14B, the gate insulating film 507 is etched in a self-aligning manner using the gate electrodes 511 to 515 as masks. Films left after the etching right under the gate electrodes are gate insulating films 524 to 528.

A resist mask 529 is next formed as shown in FIG. 14C. Doping with p-type impurity elements (boron in this embodiment) is conducted to form impurity regions 530 to 533 containing a high concentration of boron. The boron doping here is made by ion doping using diborane (B$_2$H$_6$) so that the regions contain boron in a concentration of $3 \times 10^{20}$ to $3 \times 10^{21}$ atoms/cm$^3$ (typically, $5 \times 10^{20}$ to $1 \times 10^{21}$ atoms/cm$^3$).

The impurity regions 530 to 533 have already been doped with phosphorus in a concentration of $1 \times 10^{16}$ to $5 \times 10^{18}$ atoms/cm$^3$. However, the concentration of boron in this doping is at least 300 times or more the concentration of phosphorus therein. The n-type impurity regions formed in the previous phosphorus doping are thus completely inverted to have a p-type conductivity, and the inverted regions function as p-type impurity regions.

Next, resist masks 534a to 534d are formed as shown in FIG. 14D. Doping with n-type impurity elements (phosphorus, in this embodiment) is conducted to form impurity regions 535 to 539 containing a high concentration of phosphorus. Ion doping is employed again using phosphine (PH$_3$), and the concentration of phosphorus in these regions are adjusted to $1 \times 10^{20}$ to $1 \times 10^{21}$ atoms/cm$^3$ (typically, $2 \times 10^{20}$ to $5 \times 10^{21}$ atoms/cm$^3$).

Of the impurity regions 530 to 533, the regions denoted by 540 to 543 are similarly doped with phosphorus. However, the phosphorus concentration in the regions 540 to 543 is sufficiently low relative to the concentration of the p-type impurity elements. Therefore the conductivity of the regions 540 to 543 remain p-type and is not inverted to the n-type conductivity.

A source region and a drain region of the n-channel TFT are formed through this doping step. In the switching TFT, the n-type impurity regions 519 to 521 formed in the step of FIG. 14A are partially left. The remaining regions correspond to the LDD regions 15a to 15d of the switching TFT in FIG. 2.

After removing the resist masks 534a to 534d, a protective film 544 is formed and the n-type or p-type impurity elements used in the doping are activated. The impurity elements may be activated by furnace annealing, laser annealing, and lamp annealing alone or in combination. In this embodiment, furnace annealing is carried out using an electric furnace in nitrogen atmosphere at 550° C. for four hours. (FIG. 14E)

Subsequently, a first interlayer insulating film 545 is formed as shown in FIG. 15A. The first interlayer insulating film may include the protective film 544. The first interlayer insulating film 545 may be a single layer insulating film containing silicon, or a laminate film having a combination of such insulating films. An appropriate film thickness of the first interlayer insulating film is 400 nm to 1.5 μm. This embodiment uses a laminate structure in which a silicon oxynitride film with a thickness of 200 nm is formed as the protective film 544, and a silicon oxide film with a thickness of 500 nm is formed thereon.

Contact holes are formed in the first interlayer insulating film 545 to form source wirings 546 to 549 and drain wirings 550 to 552. In this embodiment, these electrodes have a four-layer laminate structure obtained by forming successively a titanium film to 60 nm in thickness, a titanium nitride film to 40 nm, an aluminum film containing 2 wt % of silicon to 300 nm and another titanium film to 100 nm by sputtering. Needless to say, conductive films other than this may be used instead. Further, a passivation film may be formed on the wirings.

Heat treatment is then given to the film in atmosphere containing 3% of hydrogen at 300 to 450° C. for one to four hours to hydrogenate the film. This step is for hydrogen termination of dangling bonds of the semiconductor using hydrogen that is thermally excited. Other hydrogenation measures include plasma hydrogenation (using plasma-excited hydrogen).

Alternatively, the hydrogenation treatment may cut ahead of formation of the first interlayer insulating film 545. To elaborate, the above hydrogenation treatment may be performed after forming the protective film 544 and before forming the first interlayer insulating film 545.

Or the hydrogenation treatment may be conducted after forming the passivation film with a thickness of 50 to 500 nm (typically 200 to 300 nm). In this case, a silicon nitride film or a silicon oxynitride film can be used as the passivation film.

Next, a second interlayer insulating film 553 is formed from an organic resin as shown in FIG. 15B. Usable organic resins include polyimide, polyamide, aclyric resin, and BCB (benzocyclobutene). The major role of the second interlayer insulating film 553 is leveling, and hence acrylic resin having a superior leveling effect is particularly preferable. In this embodiment, an acrylic resin film is formed thick enough to satisfingly level the level difference caused by the TFTs. An appropriate thickness of the acrylic resin film is 1 to 5 μm (preferably 2 to 4 μm).

A contact hole reaching the drain wiring 552 is then formed in the second interlayer insulating film 553 to form a pixel electrode 554 from a conductive oxide film. In this embodiment, a conductive oxide film containing a compound of indium oxide and tin oxide is formed to a thickness of 110 nm as the pixel electrode 554.

Thereafter insulating films 555 and 556 are formed as shown in FIG. 15C. The insulating films 555 and 556 are formed by patterning a 200 to 300 nm thick insulating film containing silicon, or by patterning an organic resin film having the same thickness. The insulating film 555 is formed to fill a gap between the pixels (between the pixel electrodes) in order to prevent an organic EL material used for a light emitting layer and the like to be formed later from covering the end of the pixel electrode 554. The insulating film 556 is formed so as to fill the concave portion in the pixel electrode 554 and has an effect of avoiding short circuit between a cathode of the EL element and the pixel electrode.

The surface of the pixel electrode 554 is next subjected to ozone treatment. The ozone treatment in this embodiment is provided through UV light irradiation while the pixel electrode is exposed to oxygen gas. After that, a hole injection layer 557 and a light emitting layer 558 are formed by spin coating. In this embodiment, the hole injection layer 557 is formed from polythiophene (PEDOT) to have a thickness of 30 nm, and the light emitting layer 558 is formed from polyparaphenylenevinylene (PPV) to have a thickness of 80 nm.

The EL layer of this embodiment takes a two-layer structure consisting of the light emitting layer and the hole injection layer. However, the EL layer may further includes a hole transportation layer, an electron injection layer, an electron transportation layer, and the like. There have been reported many combinations of layers for the EL layer structure and any of them can be employed by the present invention. Also, the EL material is not limited to polymer materials but includes monomer materials, and it may be a combination of inorganic materials instead of the organic materials.

Next, a cathode 559 is formed to a thickness of 400 nm from a conductive film having low work function. An appropriate conductive film is the one having a work function of 2.0 to 3.0, e.g., a conductive film containing an element belonging to Group 1 or 2 in the periodic table. It is also effective to form a passivation film on the cathode 559.

An active matrix substrate structured as shown in FIG. 15C is thus completed. Incidentally, it is effective to successively perform the steps subsequent to formation of the insulating films 555 and 556 ending with formation of the cathode 559 without exposing the films to the air by adopting a film deposition apparatus of multi-chamber system (or inline system).

In actuality, after the structure of FIG. 15C is obtained, the device is preferably packaged (sealed) using a highly air-tight protective film (a laminate film, a UV-curable resin film, or the like) or a housing member such as a ceramic sealing can so as not to be exposed to the air. If the interior of the housing member is filled with inert atmosphere, or if there is a hygroscopic material (e.g., barium oxide) arranged inside, at this point, the EL layer can be improved in its reliability (lifetime).

After enhancing air-tightness by packaging or other measures, a connector (flexible printed circuit: FPC) is attached which connects a terminal lead out the element or circuit formed on the substrate with an external signal terminal. Thus the device is completed as a product. The device that is ready to be shipped is called herein a self-luminous device (or an EL module).

Figure 16:
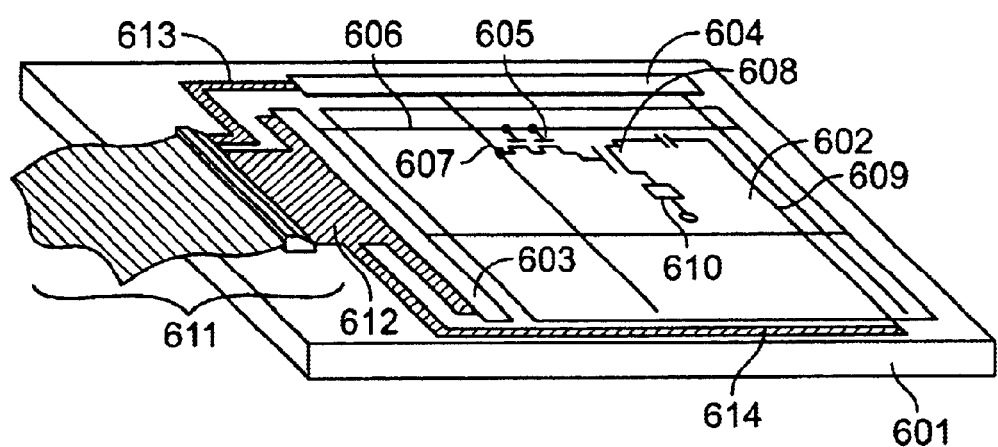
FIG. 16 is a diagram showing the appearance of the self-luminous device.

Now, a description is given of the structure of the active matrix self-luminous device according to this embodiment with reference to a perspective view of FIG. 16. The active matrix self-luminous device according to this embodiment is composed of a pixel portion 602, a gate side driver circuit 603, and a source side driver circuit 604, which are formed on a glass substrate 601. A switching TFT 605 of the pixel portion is an n-channel TFT, and is arranged at an intersection between a gate wiring 606 connected to the gate side driver circuit 603 and a source wiring 607 connected to the source side driver circuit 604. The switching TFT 605 has a drain region connected to a gate of a current controlling TFT 608.

A source of the current controlling TFT 608 is connected to a power supply line 609. In the structure according to this embodiment, ground potential (earth potential) is given to the power supply line 609. The current controlling TFT 608 has a drain region connected to an EL element 610. A given voltage (10 to 12 V, in this embodiment) is applied to a cathode of the EL element 610.

An FPC 611 serving as an external input/output terminal is provided with input/output wirings (connection wirings) 612 and 613 for transmitting signals to the driver circuits, and an input/output wiring 614 connected to the power supply line 609.

Figure 17A:
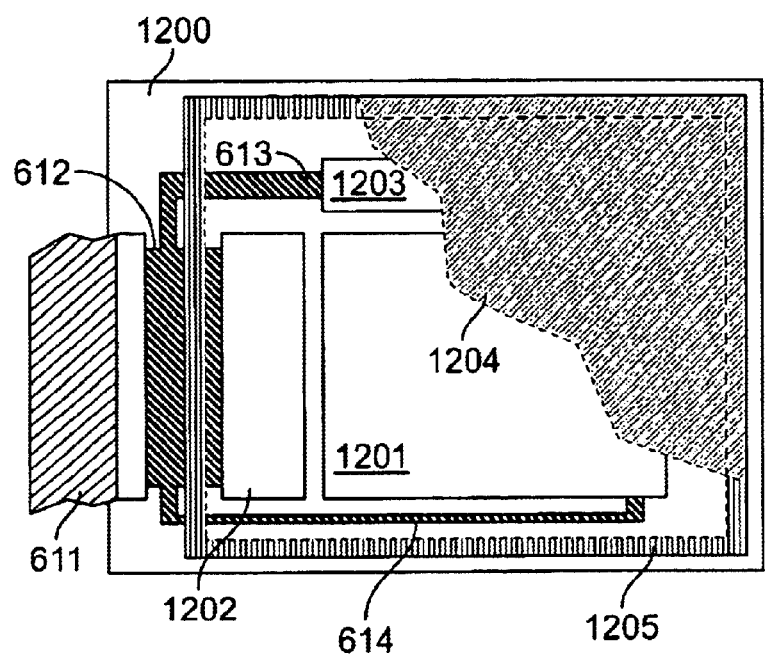
FIGS. 17A and 17B are diagrams showing the appearance of the self-luminous device.

The self-luminous device of this embodiment including the housing member will be described with reference to FIGS. 17A and 17B. The reference symbols in FIG. 16 will be used as the need arises.

A pixel portion 1201, a data signal side driver circuit 1202, and a gate signal side driver circuit 1203 are formed on a substrate 1200. The wirings from the respective driver circuits are connected through the input/output wirings 612 to 614 to the FPC 611 and to external equipment.

A housing member 1204 is provided at this point such that it surrounds at least the pixel portion, preferably the pixel portion and the driver circuits. The housing member 1204 is shaped to have a concave portion whose inner size is larger than the outer size of the EL element, or is shaped into a sheet. Using an adhesive 1205, the housing member 1204 is adhered to the substrate 1200 such that an air-tight space is formed between the housing member 1204 and the substrate 1200. Then the EL element is thoroughly sealed in the air-tight space and the outside air is totally shut off. The housing member 1204 may be provided in plurals.

A preferable material for the housing member 1204 is an insulating substance such as glass and polymer. Given as examples thereof are amorphous glass (such as borosilicate glass and quartz), crystalline glass, ceramic glass, organic resins (such as acrylic resins, styrene resins, polycarbonate resins, and epoxy resins), and silicon resins. Ceramics may also be used. If the adhesive 1205 is an insulating substance, it is also possible to use a metal material such as a stainless alloy for the housing member.

An adhesive made of epoxy resin or acrylate resin can be used as the adhesive 1205. It is also possible to use as the adhesive 1205 a thermally curable resin or a photo-curable resin. However the material of the adhesive is required to transmit least oxygen and moisture.

A gap 1206 between the housing member and the substrate 1200 is desirably filled with inert gas (such as argon, helium, or nitrogen). The gap may not always be filled with gas but with inert liquid (such as liquid fluorocarbon exemplified by perfluoroalkan). An appropriate inert liquid is disclosed in Japanese Patent Application Laid-open No. Hei 8-78519.

To put a drying agent in the gap 1206 is also effective. An appropriate material for the drying agent is disclosed in Japanese Patent Application Laid-open No. Hei 9-148066. Typically, barium oxide is used.

Figure 17B:
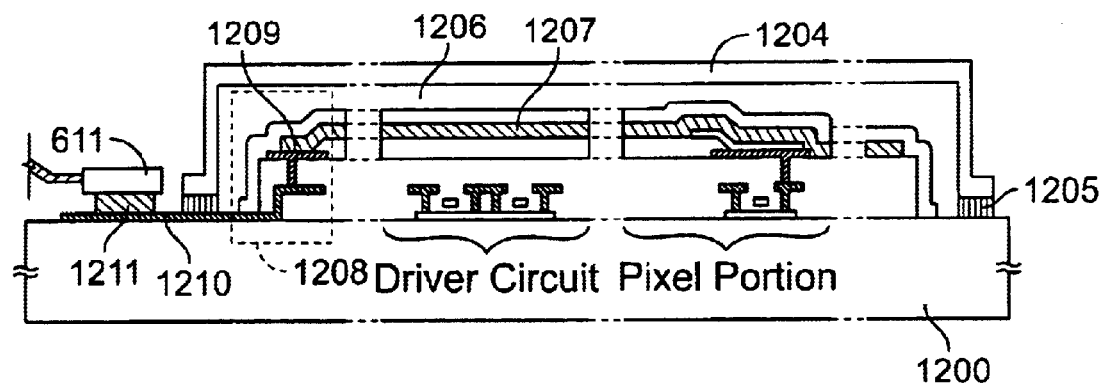

As shown in FIG. 17B, the pixel portion is provided with a plurality of pixels each having an independent EL element. All of the pixels have a protective electrode 1207 as an electrode common to the pixels. The EL layer, the cathode (MgAg electrode), and the protective electrode are preferably formed successively without exposing them to the air in this embodiment. However, the structure of FIG. 17B can be obtained also by forming the EL layer and the cathode using the same mask while forming the protective electrode using another mask.

At this point, the EL layer and the cathode are formed only on the pixel portion, and it is unnecessary to form them on the driver circuits. Though the EL layer and the cathode formed on the driver circuits do not cause any trouble of course, considering that the EL layer contains an alkali metal, it is better if they are not formed on the driver circuits.

In a region denoted by 1208, the protective electrode 1207 is connected to an input/output wiring 1210 through a connecting wiring 1209 that is formed of the same material as the pixel electrode. The input/output wiring 1210 is a power supply line for applying a given voltage (ground potential in this embodiment, specifically, 0V) to the protective electrode 1207. The input/output wiring 1210 is connected to the FPC 611 through a conductive paste material 1211.

Figure 18A:
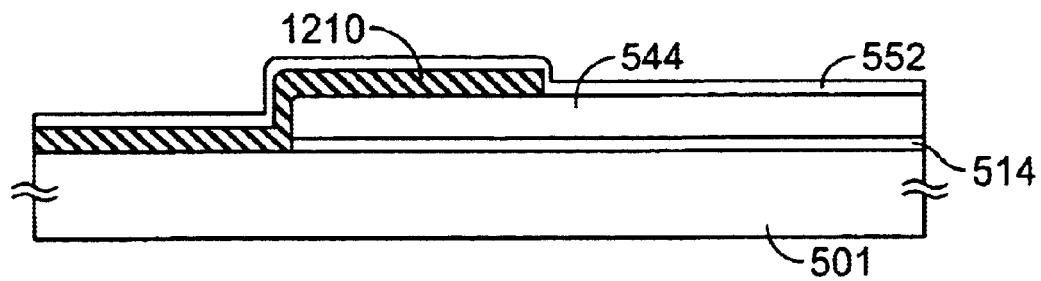
FIGS. 18A to 18C are diagrams showing a process of forming a contact structure.
Figure 18B:
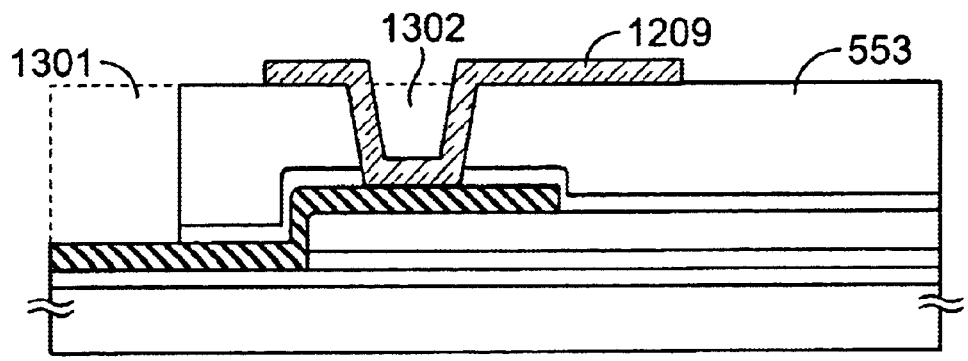
Figure 18C:
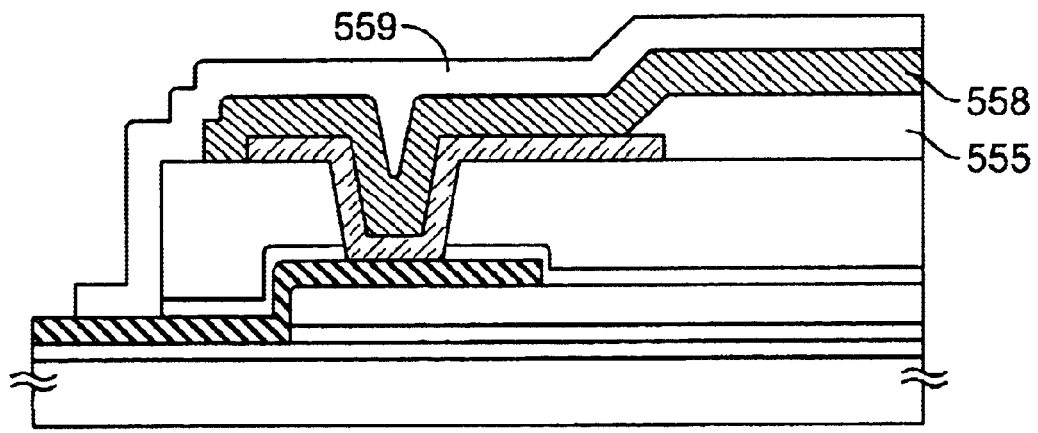

Given next with reference to FIGS. 18A to 18C is a description of a process of forming a contact structure in the region 1208.

First, the state illustrated in FIG. 15A is obtained following the process of manufacturing the self-luminous device according to this embodiment. At this point, an end of the substrate (the region denoted by 1208 in FIG. 17B) is rid of the first interlayer insulating film 544 and the gate insulating film 514 thereof, and the input/output wiring 1210 is formed thereon. Needless to say, the input/output wiring 1210, and the source wiring and the drain wiring of FIG. 15A are formed simultaneously. (FIG. 18A)

Next, the second interlayer insulating film 553 in FIG. 15B is partially etched. The connection wiring 1209 is formed on an opening 1302 to obtain the structure shown in FIG. 18B. The connection wiring 1209 and the pixel electrode 554 in FIG. 15B are simultaneously formed. (FIG. 18B)

The EL elements are to be formed in the pixel portion in this state (corresponding to formation of a third interlayer insulating film, an EL layer, and a cathode). When forming these films, the region shown in FIGS. 13A to 13E is covered with a mask or the like so that the third interlayer insulating film and the EL element are not formed in this region. After forming the cathode 557, the protective electrode 558 is formed using another mask. The protective electrode 558 is thus electrically connected to the input/output wiring 1210 through the connection wiring 1209. A second passivation film 559 is further formed thereon to obtain the state of FIG. 18C.

Through the above steps, the contact structure in the region denoted by 1208 in FIG. 17B is obtained. The input/output wiring 1210 is connected to the FPC 611 passing through a gap between the housing member 1204 and the substrate 1200 (the gap is filled with the adhesive 1205. In other words, the adhesive 1205 has to be thick enough to satisfyingly level the level difference caused by the input/output wiring). Although only the input/output wiring 1210 is mentioned here, the other input/output wirings 612 to 614 are similarly connected to the FPC 611 passing under the housing member 1204.

[Embodiment 4]

This embodiment describes an example of a pixel structure of the active matrix self-luminous device manufactured in accordance with Embodiment 3. The description will be given with reference to FIGS. 19A and 19B. In FIGS. 19A and 19B, components corresponding to those in FIGS. 1A and 1B and in FIG. 2 are denoted by the reference symbols of FIGS. 1A to 2.

In FIGS. 19A and 19B, a wiring denoted by 1901 is a gate wiring for electrically connecting a gate electrode of a switching TFT 201. The switching TFT 201 has a source region 13 connected to a source wiring 21, and has a drain region 14 connected to a drain wiring 22. The drain wiring 22 is electrically connected to a gate electrode 29 of a current controlling TFT 202. The current controlling TFT 202 has a source region 26 electrically connected to a power supply line 1902, and has a drain region 27 electrically connected to a drain wiring 31.

A storage capacitor is formed at this point in a region denoted by 1903. The storage capacitor 1903 is formed among a semiconductor film 1904 electrically connected to the power supply line 1902 through a contact hole 1906, an insulating film (not shown) formed of the same layer as a gate insulating film, and the gate electrode 29. The semiconductor film 1904 and semiconductor films for forming the switching TFT and the current controlling TFT are deposited simultaneously. After that, the semiconductor film 1904 is separate from the semiconductor film for forming the switching TFT and the current controlling TFT, and hence is called herein a separate semiconductor film. Specifically, the separate semiconductor film 1904 is isolated of the active layer for forming the source region 13 of the switching TFT and the drain region 14 thereof and the source region 26 of the current controlling TFT and the drain region 27 thereof, as can be seen in FIG. 19A. In the region denoted by 1903, the separate semiconductor film 1904 overlaps with the gate electrode 29 with the gate insulating film sandwiched therebetween. The portion that overlaps with the gate electrode 29 at this point occupies 60% or more of the entire separate semiconductor film 1904. The 60% or more of the separate semiconductor film 1904 further overlaps with the power supply line 1902 with the first interlayer insulating film sandwiched therebetween. A capacitor formed from the gate electrode 29, the same layer (not shown) as the first interlayer insulating film, and the power supply line 1902 can also be used as the storage capacitor.

Note that the storage capacitor comprised the separate semiconductor film 1904, a gate insulating film and a gate electrode 29 is formed simultaneously with TFTs which are shown in FIGS. 13A to 15C.

Specifically, as shown in FIG. 13D, the separate semiconductor film 1904 formed in FIGS. 13A to 13C are doped with n-type impurities. Further, as shown in FIG. 13E, a gate electrode is formed over the separate semiconductor film 1904. In addition, an interlayer insulating film is formed over the gate electrode and the power supply line 1902 is formed over the interlayer insulating film. In this way, the storage capacitor is formed.

The structure according to this embodiment is effective especially for a large-area image display region. The reason thereof is given below.

The self-luminous device of the present invention is driven while one frame is divided into a plurality of fields, and hence the load applied to the driver circuits for driving the pixel portion is large. In order to diminish the load, the load of the pixel portion (wiring resistance, parasitic capacitance or writing capacitance for the TFTs) has to be reduced as much as possible.

The parasitic capacitance added to a data wiring and the gate wiring in TFT writing is mostly formed between the wirings and the cathode (or protective electrode) of the EL element formed on the wirings. The parasitic capacitance formed there is negligible because an organic resin film having a low relative dielectric constant is formed as a second interlayer insulating film to a thickness of 1.5 to 2.5 $\mu$m.

Now that the parasitic capacitance has ceased to be problem, the largest obstacle in applying the present invention to a self-luminous device having a large-area pixel portion is wiring resistance of the data wiring and the gate wiring. Of course the wiring resistance can be reduced by dividing the data signal side driver circuit into plural circuits for parallel processing, or by providing the data signal side driver circuits and the gate signal side driver circuits so as to sandwich the pixel portion to send signals bidirectionally and substantially drop the operating frequency of the driver circuits. However, this causes another problem of increase in area the driver circuits occupy.

Accordingly, it is very effective in carrying out the present invention to reduce the wiring resistance of the gate wiring as much as possible by the structure of this embodiment. The display device having the configuration disclosed in this embodiment can be driven by the digital driving methods disclosed in this specification. However, it can be driven by another method such as an analog driving method if desired. Also, this embodiment can be freely combined with any of the structures of Embodiments 1 to 3.

[Embodiment 5]

Figure 20:
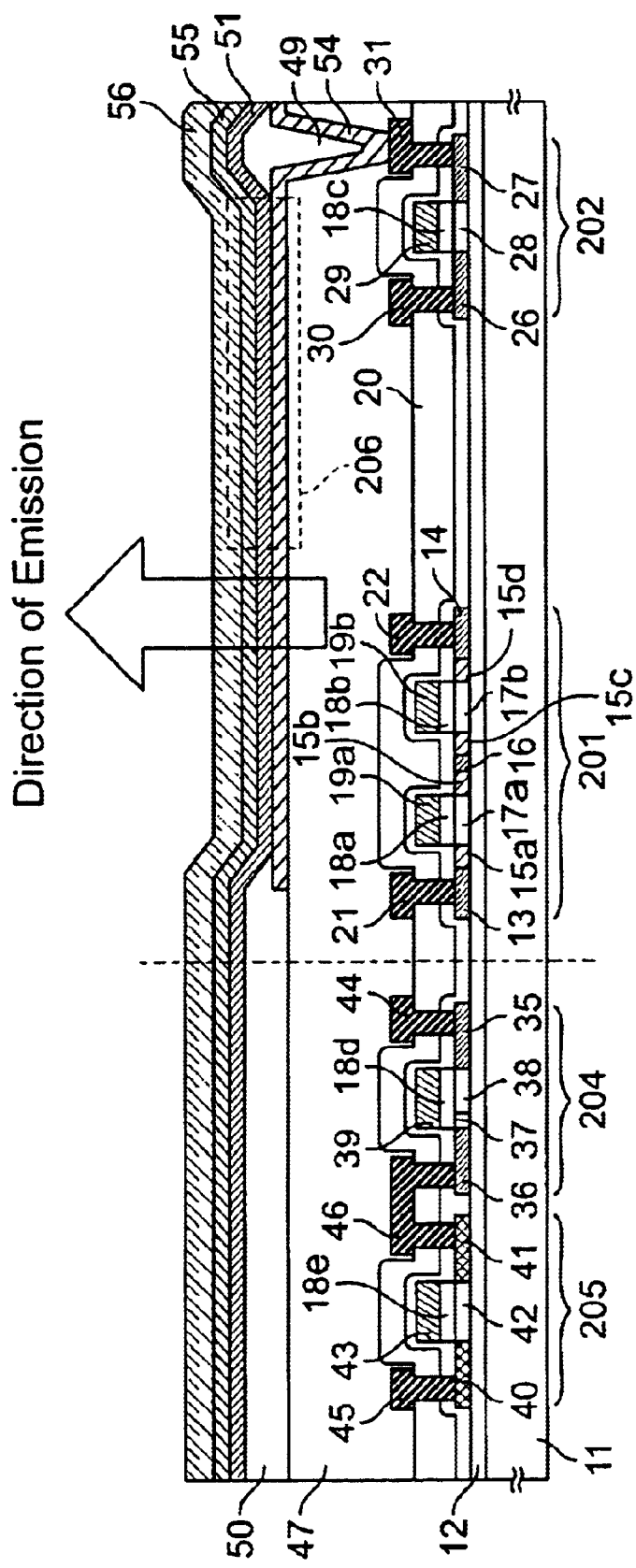
FIG. 20 is a diagram showing in section the structure of the self-luminous device.

Embodiment 5 gives with reference to FIG. 20 a description of the case in which a pixel portion is structured differently than the illustration of FIG. 2. In FIG. 20, the same structure as FIG. 2 is denoted by the same reference symbols, so see FIG. 2 if necessary.

According to the self-luminous device shown in FIG. 20, a channel forming region 28 in a current controlling TFT 202 overlaps with a gate electrode 29 with a gate insulating film 18 sandwiched therebetween.

In this embodiment, a contact hole is formed in a second interlayer insulating film 47 to form a pixel electrode 54. The pixel electrode 54 in this embodiment is formed from an aluminum alloy film (aluminum film containing 1 wt % of titanium) with a thickness of 200 nm. Any metal material can be used as the material of the pixel electrode, but a material having a high reflectance is preferable.

Insulating films 49 and 50 are then formed. The insulating films 49 and 50 are formed by patterning a 200 to 300 nm thick insulating film containing silicon, or an organic resin film having the same thickness. An EL layer 51 is further formed on the insulating films 49 and 50.

Upon completion of the formation of the EL layer 51, a hole injection layer 55 and an anode 56 are formed thereon. In this embodiment, the hole injection layer 55 is formed from polythiophene (PEDOT) to have a thickness of 30 nm, and the anode 56 is formed from a conductive oxide film containing a compound of indium oxide and tin oxide to have a thickness of 110 nm. An EL element 206 is thus formed. Note that the positions of the cathode and the anode in this case are reverse to the case of FIG. 2.

According to the structure of this embodiment, red light, green light or blue light generated in each pixel is emitted to one side of the substrate opposite to the side on which the TFTs are formed. Therefore almost all the regions in each pixel, including the regions where the TFTs are formed, can be effective light emission regions. As a result, the effective light emission area of the pixel is greatly improved as well as the brightness of displayed images and the contrast ratio (brightness/darkness ratio).

The structure of this embodiment can be freely combined with any of the structures of Embodiments 1 to 4.

[Embodiment 6]

Figure 21:
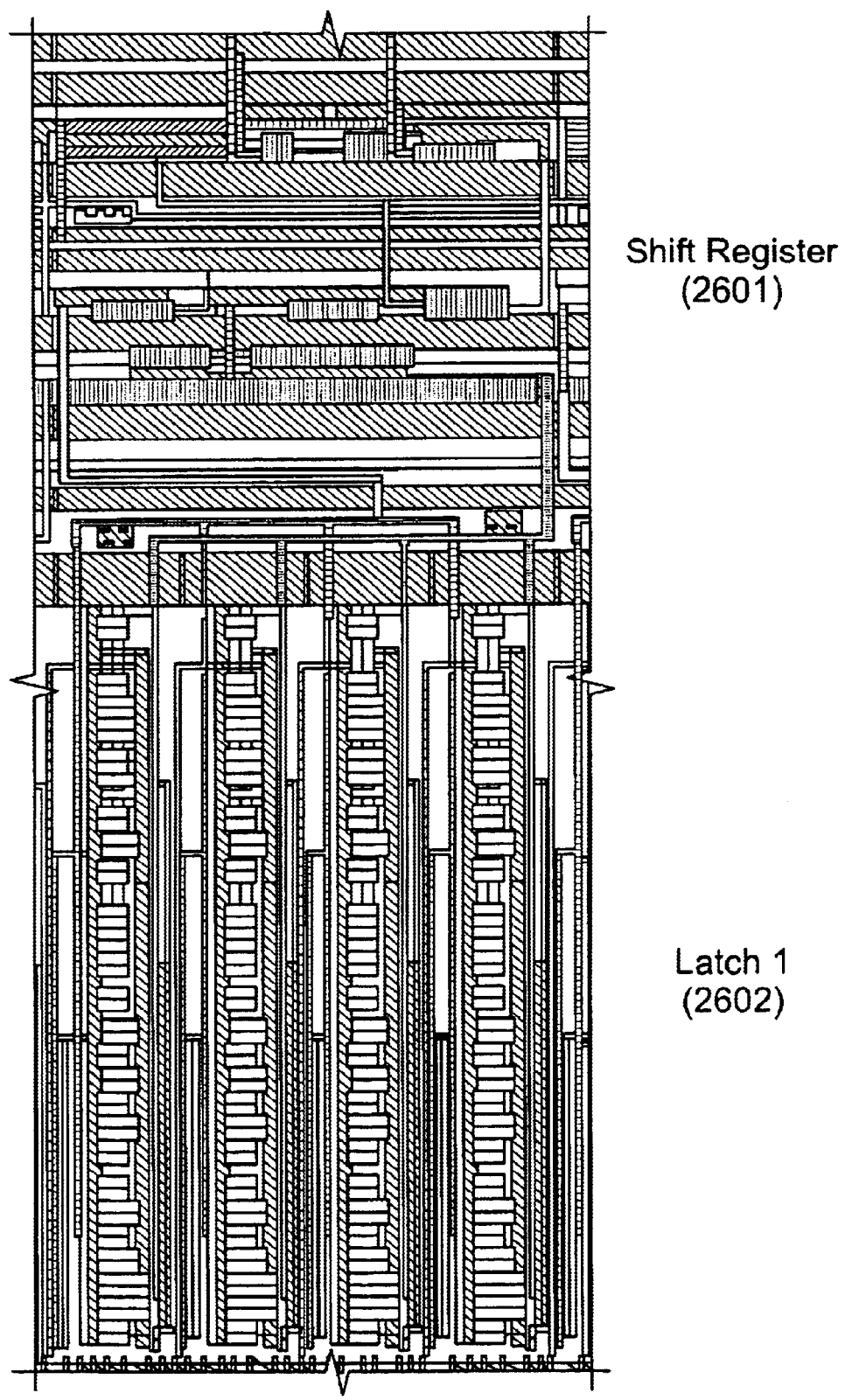
FIG. 21 is a diagram showing a part of a source driver circuit of the self-luminous device.

FIG. 21 shows a part of a source driver circuit used in the present invention. In FIG. 21, reference symbols 2601 and 2602 denote a shift register and a latch 1, respectively. The structure of this embodiment can be freely combined with any of the structures of Embodiments 1 to 5.

[Embodiment 7]

Figure 22A:
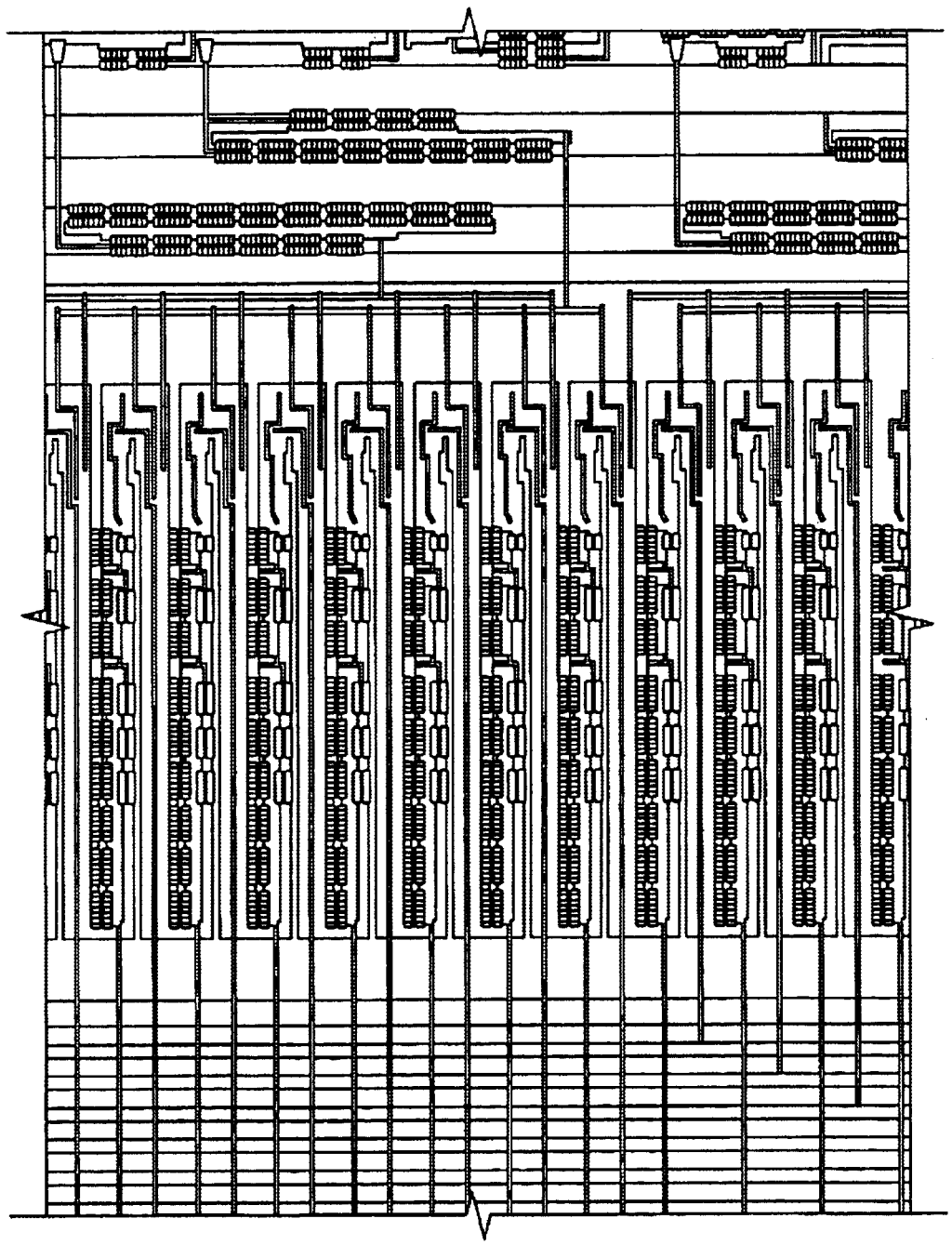
FIGS. 22A and 22B are, respectively, a picture showing a driver circuit in a pixel portion of a self-luminous device to which the present invention is applied and a picture of an image displayed by the self-luminous device.
Figure 22B:
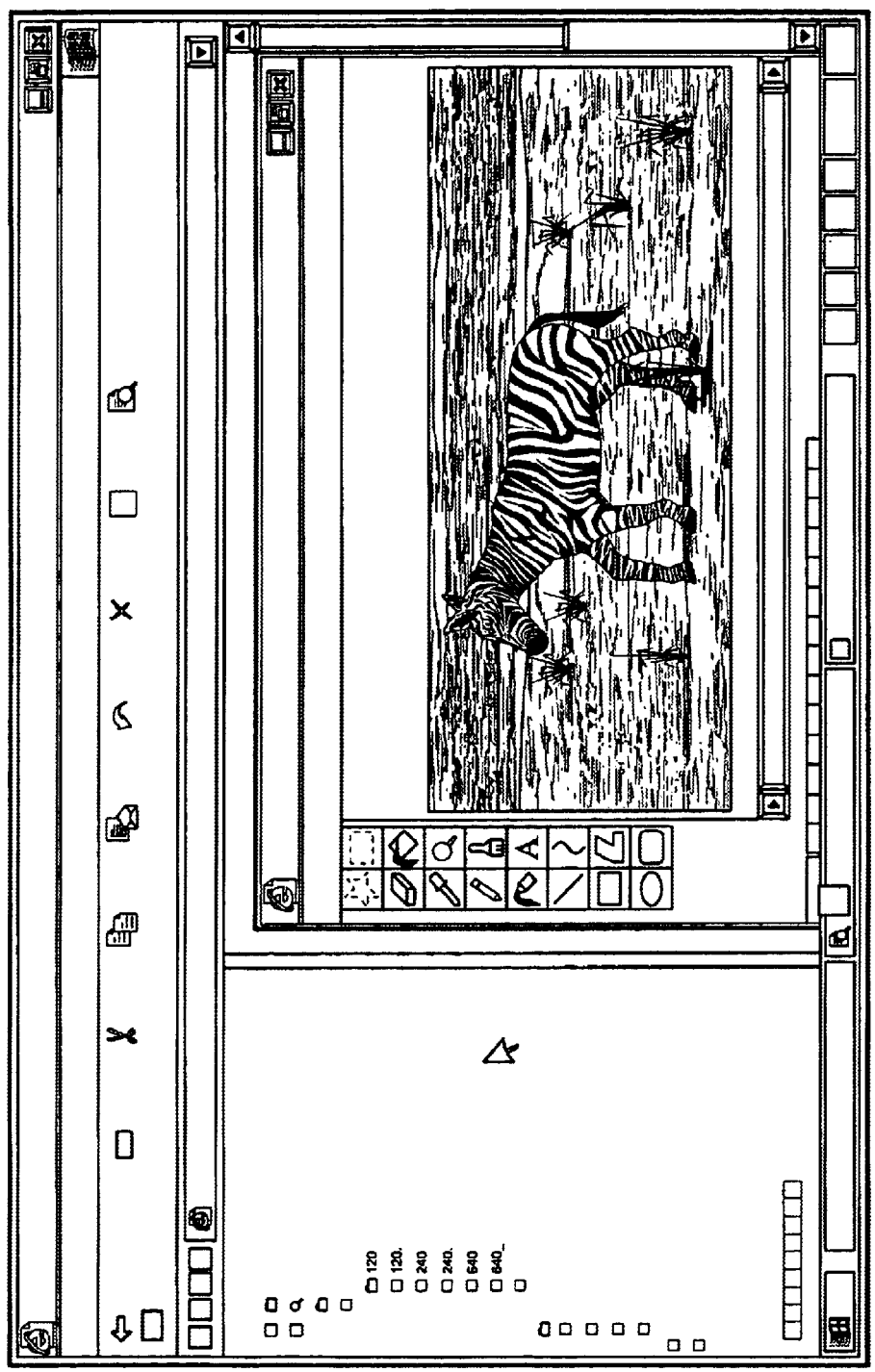
Figure 23:
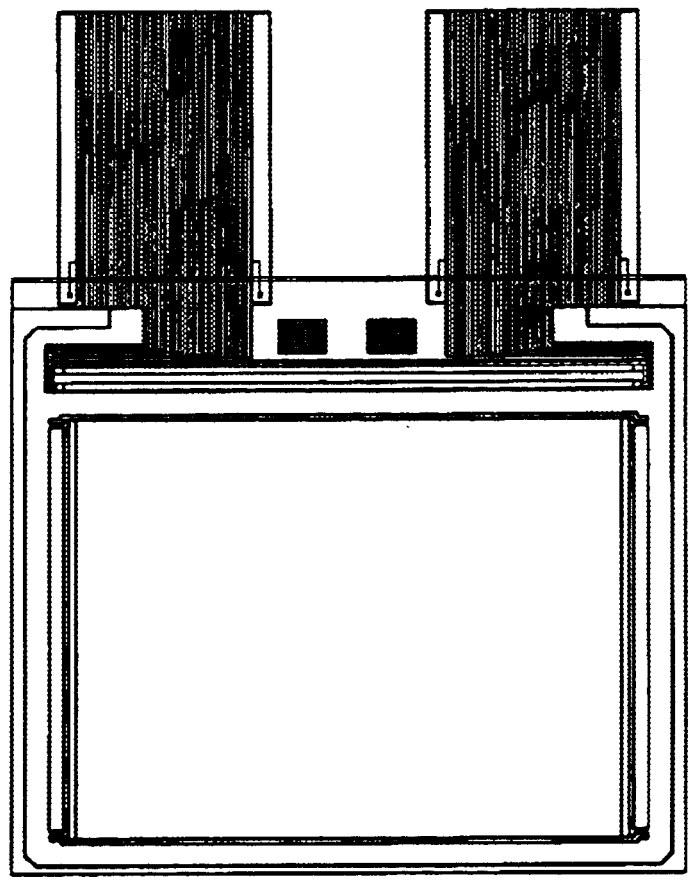
FIG. 23 is a picture of a self-luminous device to which the present invention is applied.

FIG. 22A is a picture of a driver circuit used in the present invention, and FIG. 22B shows a picture of a screen display a still image. Shown in FIG. 23 is a picture of the appearance of an active matrix self-luminous device manufactured in accordance with the present invention. The structure of this embodiment can be freely combined with any of the structures of Embodiments 1 to 6.

[Embodiment 8]

In the structure shown in FIG. 2 in accordance with Embodiment 1, it is effective to use a material highly capable of releasing heat for the base film 12 that is provided between the active layer and the substrate 11. The current controlling TFT, in particular, in which a relatively large amount of current flows for a long period of time, easily generates heat and hence degradation by self-generated heat could be a problem for the current controlling TFT. Then if the base film has a heat releasing effect as in this embodiment, degradation of the TFT by heat can be contained.

Given as an example of a light-transmissive material having a heat releasing effect is an insulating film containing: at least one element selected from the group consisting of B (boron), C (carbon), and N (nitrogen); and at least one element selected from the group consisting of Al (aluminum), Si (silicon), and P (phosphorus).

For instance, nitrides of aluminum represented by aluminum nitride (AlxNy), carbides of silicon represented by silicon carbide (SixCy), nitrides of silicon represented by silicon nitride (SixNy), nitrides of boron represented by boron nitride (BxNy), or phosphides of boron represented by boron phosphide (BxPy) can be used. Oxides of aluminum represented by aluminum oxide (AlxOy) are superior in light transmissivity and has a heat conductivity of 20 Wm$^{-1}$K$^{-1}$, which makes them preferable materials for the base film. The symbols x and y in the above light transmissive materials denote arbitrary integers.

The compounds above may be combined with other elements. For instance, nitrogen may be added to aluminum oxide and the resulting aluminum oxynitride expressed as AlNxOy can be used as the base film. This material also has an effect of preventing moisture, alkali metals and the like from seeping inside in addition to the heat releasing effect. The symbols x and y in the above aluminum oxynitride denote arbitrary integers.

Materials disclosed in Japanese Patent Application Laid-open No. Sho 62-90260 can also be used. That is, an insulating film containing Si, Al, N, O, or M can be used as the base film (M is at least one rare earth element, preferably an element selected from the group consisting of Ce (cerium), Yb (ytterbium), Sm (samarium), Er (erbium), Y (yttrium), La (lanthanum), Gd (gadolinium), Dy (dysprosium), and Nd (neodium)). These materials also have an effect of preventing moisture, alkali metals and the like from seeping inside in addition to the heat releasing effect.

Another usable material for the base film is a carbon film including at least a diamond thin film or an amorphous carbon film (especially the one having a characteristic similar to diamond and called diamond-like carbon). The carbon film has an extremely high heat conductivity and hence is very effective as a heat releasing layer. However, the carbon film turns brownish and lose transmissivity when formed thick. Therefore it is desirable to form the carbon film as thin as possible (preferably 5 to 100 nm).

One of the above materials having a heat releasing effect is formed into a thin film to be used alone. Alternatively, several materials of the above materials may be formed into thin films so that the thin films are layered into an insulating film containing silicon.

The structure of this embodiment can be freely combined with any of the structures of Embodiments 1 to 7.

[Embodiment 9]

Although organic EL materials are preferred as a material for the EL layer of the present invention as described in Embodiment 3, the present invention can be carried out also when inorganic EL materials are used. However, inorganic EL materials at present have very high driving voltage and therefore it is necessary to use TFTs having withstand voltage characteristics that can stand such high driving voltage.

If inorganic EL materials having lower driving voltage are developed in future, those can also be used in the present invention.

The structure of this embodiment can be freely combined with any of the structures of Embodiments 1 to 8.

[Embodiment 10]

Figure 24:
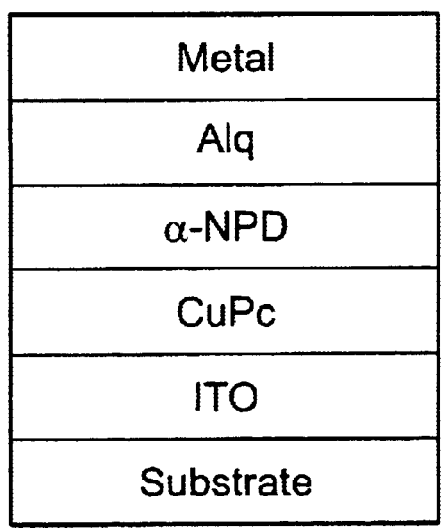
FIGS. 24A and 24B are diagrams each showing the structure of an EL element.
Figure 24:
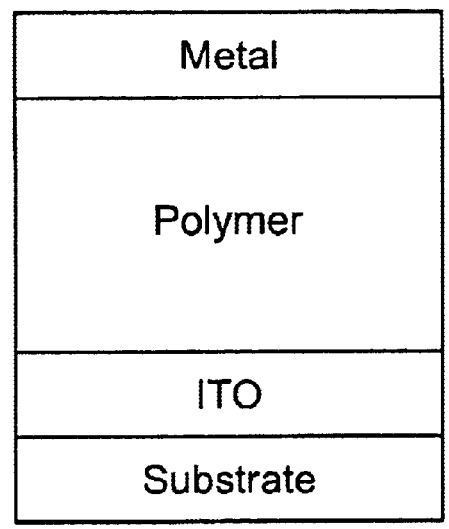

FIGS. 24A and 24B show examples of the structure of the EL element used in carrying out the present invention. FIG. 24A illustrates a case of using a monomer EL material, in which an ITO electrode (shown as ITO in FIG. 24A) is formed on a substrate. Then a buffer layer of an anode is formed from copper phthalocyanine (CuPc), a hole transportation layer is formed from a-NPD, and a light emitting layer is formed from Alq. These layers are formed by evaporation and successively layered on the ITO electrode formed on the substrate. The vacuum during evaporation is $2 \times 10^{-6}$ Torr or less.

FIG. 24B shows the element structure when a polymer EL material is used. An ITO electrode is formed on the substrate, a polymer layer is formed by spin coating, and a (metal) cathode is formed by evaporation. The vacuum during evaporation is $4 \times 10^{-6}$ Torr or less. In this embodiment, the light emitting layer is common to all the pixels to produce a panel for monochrome display. When the cathode is formed by evaporation, a metal mask is used so that the metal cathode is deposited only on necessary portions. After completing the EL element, the element is sealed with a resin.

The structure of this embodiment can be freely combined with any of the structures of Embodiments 1 to 9.

[Embodiment 11]

Figure 25:
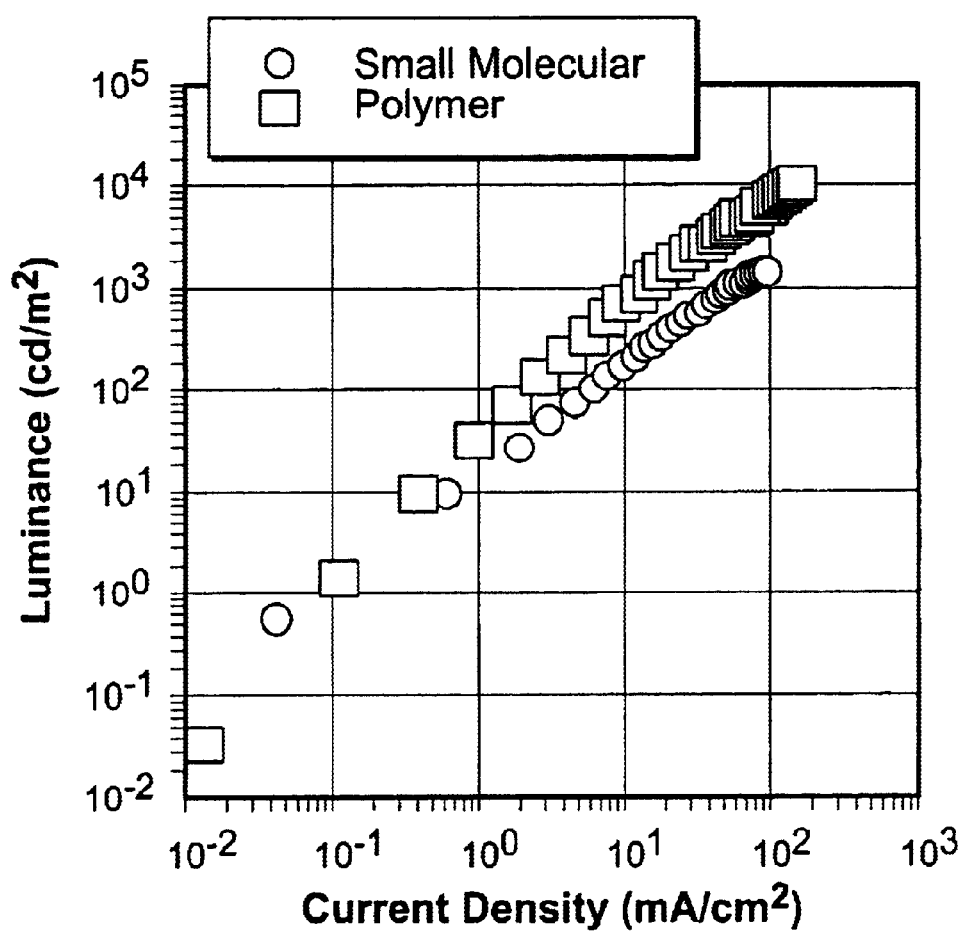
FIG. 25 is a graph showing a characteristic of an EL element.

Characteristics of the EL elements described in Embodiment 10 are shown in FIG. 25. The graph is obtained as a result of measuring current density and luminance of the EL elements when a given voltage is applied thereto. In the graph, both of the monomers EL element and the polymer EL element reach several hundreds candela at a current density of 10 mA/cm$^2$, which means that both of them demonstrate enough efficiency for application as an EL display.

The structure of this embodiment can be freely combined with any of the structures of Embodiments 1 to 10.

[Embodiment 12]

An active matrix self-luminous display (or EL module) manufactured by carrying out the present invention is superior in visibility in bright surroundings to liquid crystal display devices because it emits light by itself. Therefore the present invention can be embodied in a direct-view EL display (meaning a display having a self-luminous device incorporated therein). Examples of the EL display include monitors for personal computers, monitors for receiving television broadcasting, advertisement display monitors, and the like.

The present invention can also be embodied in every electric machine that has as its component a display including the above EL display.

Given as an example of such electric machine are EL displays, video cameras, digital cameras, goggle type displays (i.e., head mount displays), navigation systems for vehicles, personal computers, portable information terminals (such as mobile computers, cellular phones and electronic books), image reproducing machines provided with a recording medium (specifically, machines provided with a display for replaying a recording medium such as a compact disc (CD), a laser disc (LD), or a digital video disk (DVD) to display images recorded in the medium). Some of these electric machines are shown in FIGS. 26A to 26F.

Figure 26A:
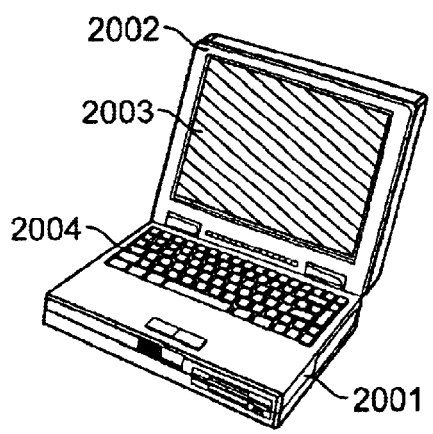
FIGS. 26A to 26F are diagrams showing specific examples of an electric machine.

FIG. 26A shows a personal computer, which is composed of a main body 2001, a casing 2002, a display device 2003, a keyboard 2004, etc. The present invention can be used for the display device 2003.

Figure 26B:
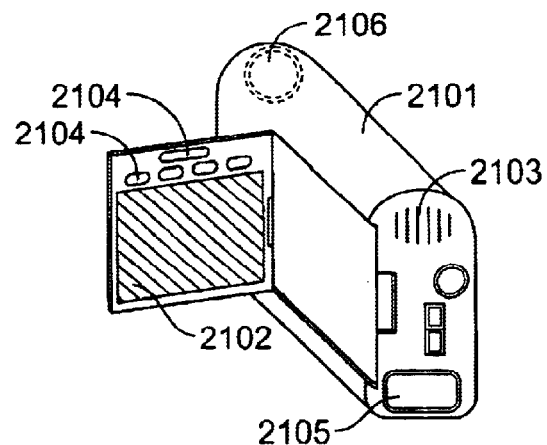

FIG. 26B shows a video camera, which is composed of a main body 2101, a display device 2102, an audio input unit 2103, operation switches 2104, a battery 2105, an image receiving unit 2106, etc. The present invention can be used for the display device 2102. With the present invention, the display device 2102 can be a panel whose diagonal size is 4 inch.

Figure 26C:
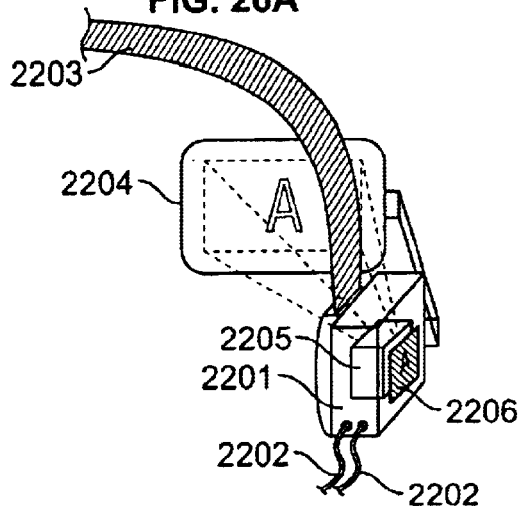

FIG. 26C shows a goggle type display, which is composed of a main body 2201, a display device 2202, arm portions 2203, etc. The present invention can be used for the display device 2202.

Figure 26D:
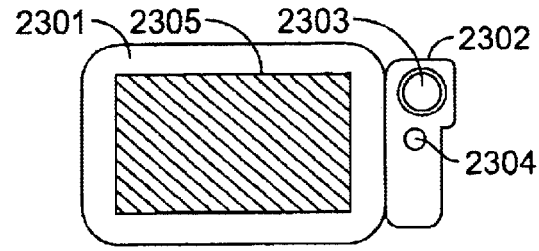

FIG. 26D shows a portable (mobile) computer, which is composed of a main body 2301, a camera unit 2302, an image receiving unit 2303, operation switches 2304, a display device 2305, etc. The present invention can be used for the display device 2305.

Figure 26E:
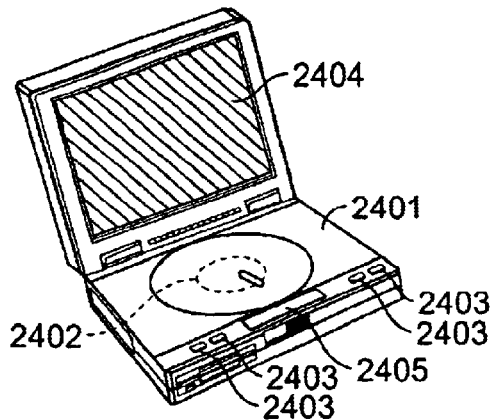

FIG. 26E shows an image reproducing machine provided with a recording medium (specifically, a DVD player). The image reproducing machine is composed of a main body 2401, a recording medium (CD, LD, DVD, or the like) 2402, operation switches 2403, a display device (a) 2404, a display device (b) 2405, etc. The display device (a) mainly display image information whereas the display device (b) mainly displays text information. The present invention can be used for the display devices (a) and (b). The present invention also can be applied to other image reproducing machines provided with a recording medium, such as CD players and game machines.

Figure 26F:
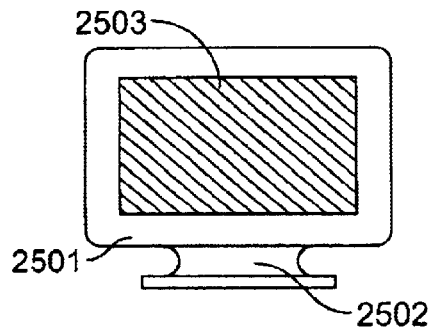

FIG. 26F shows an EL display, which is composed of a casing 2501, a supporting base 2502, a display device 2503, etc. The present invention can be used for the display device 2503. In the case where the area of the image display region of the display device is 10 inch or more in diagonal size, the pixel structure as the one shown in Embodiment 5 is effective.

If the luminance of light emitted from EL materials is improved in future, the present invention can be used in front or rear type projectors.

As described above, the application range of the present invention is so wide that it can be applied to electric machines of all fields. The electric machines shown in this embodiment can be obtained using any combinations of structures of Embodiments 1 to 11.

[Embodiment 13]

Embodiment 13 gives a description on what voltage-current characteristic the range for driving the current controlling TFT has when the driving method of the EL display according to the present invention is employed.

In the EL elements, even the slightest change in applied voltage can change exponentially the current flowing through the EL element. From another perspective, the value of the voltage applied to the EL element is not changed much when the amount of current flowing through the EL element changes. The luminance of the EL element is increased substantially in proportion to the amount of current flowing through the EL element. Accordingly, to control the luminance of the El element by controlling the amount of current (current value) flowing through the EL element is easier than by controlling the magnitude of voltage (voltage value) applied to the EL element, and is less likely to be affected by fluctuation in characteristic of TFTs.

Figure 3:
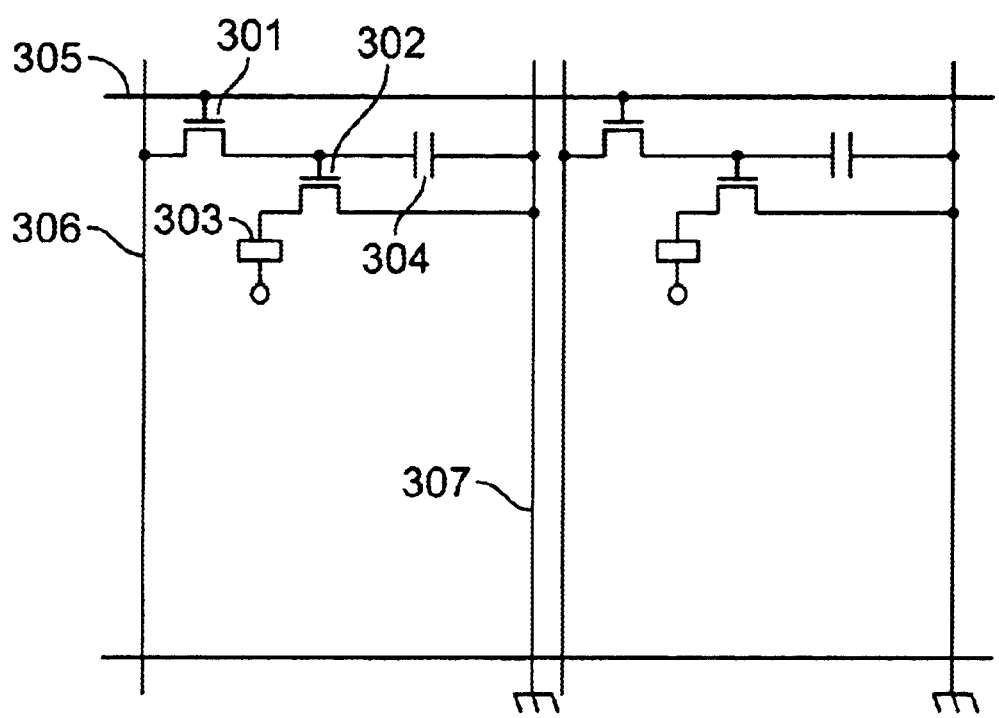
FIG. 3 is a diagram showing the structure of a pixel portion in a conventional self-luminous device.
Figure 4A:
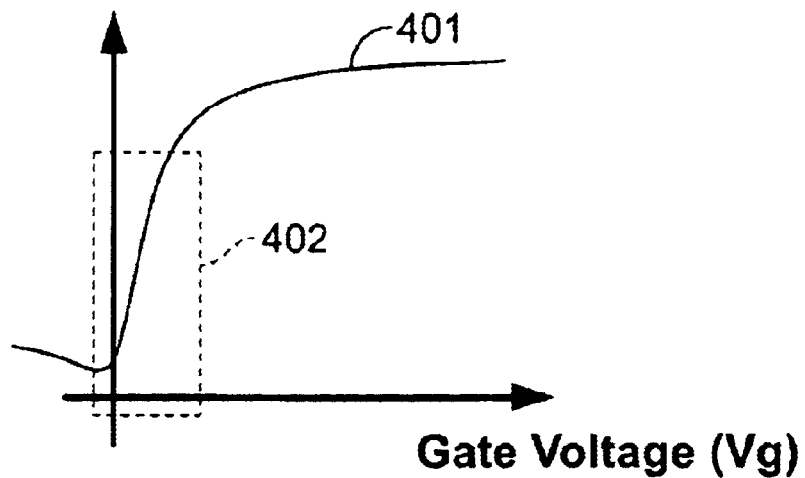
FIGS. 4A and 4B are diagrams illustrating a TFT characteristic utilized in an analog gray scale method.
Figure 4B:
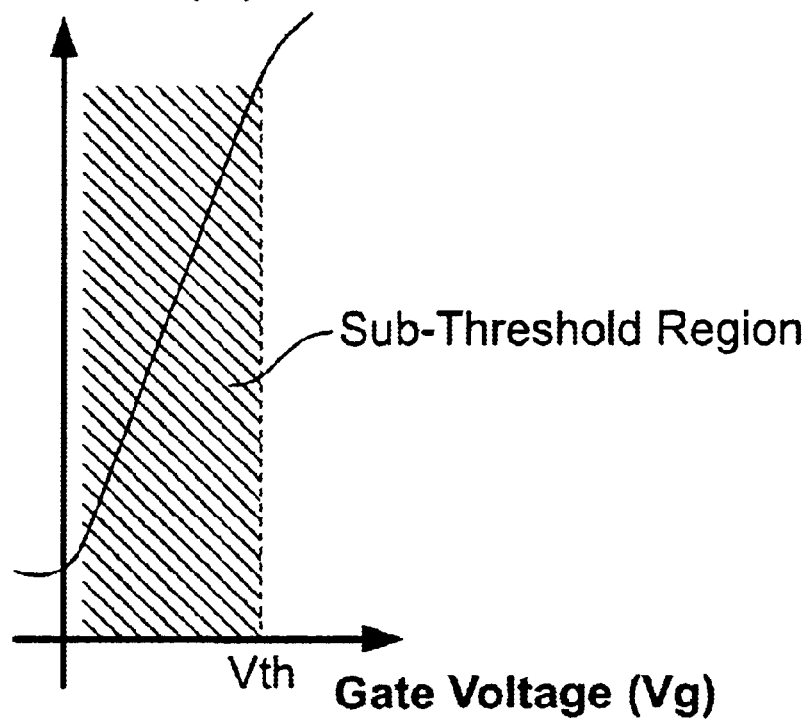
Figure 27A:
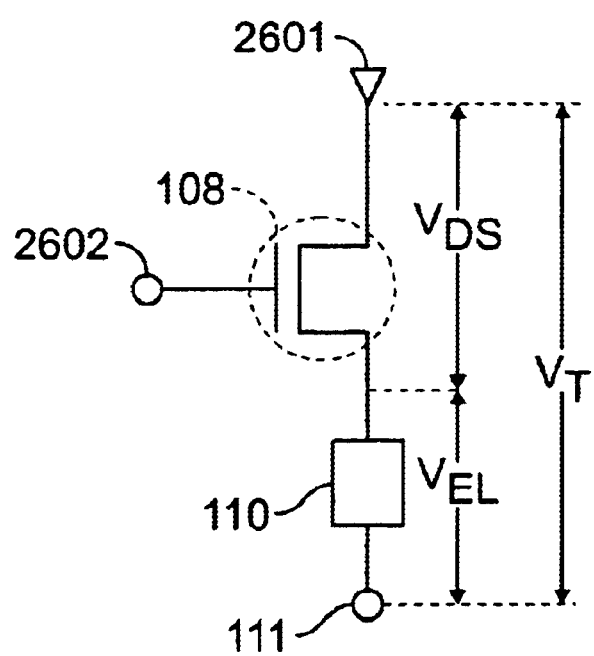
FIGS. 27A and 27B are a diagram showing the structure of connection between an EL element and a current controlling TFT and a graph showing voltage-current characteristics of the EL element and the current controlling TFT, respectively.
Figure 27B:
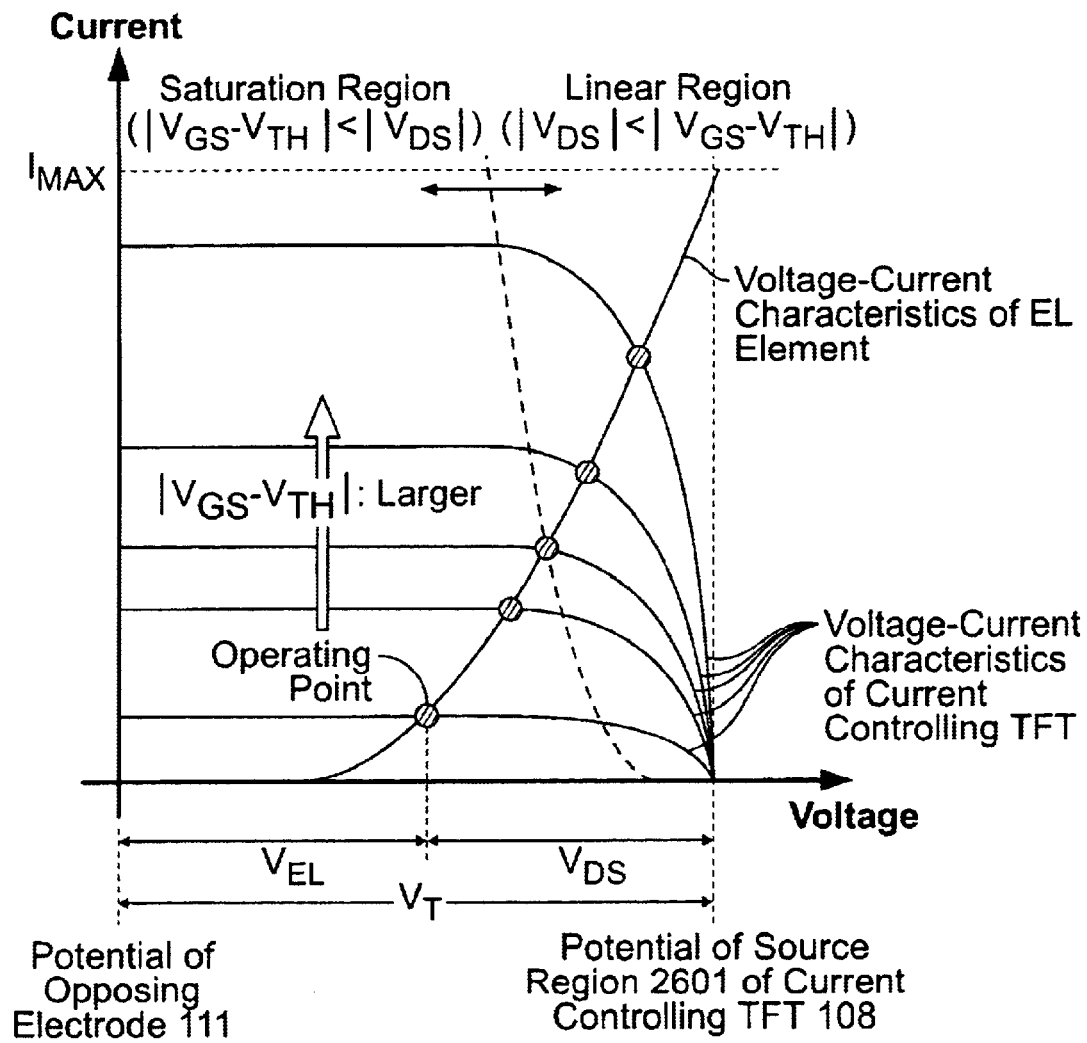

Reference is made to FIGS. 27A and 27B. FIG. 27A shows the current controlling TFT 108 and the EL element 110, which are a part of the pixel of the EL display illustrated in FIG. 3 in accordance with the present invention. FIG. 27B shows voltage-current characteristics of the current controlling TFT 108 and the EL element 110 which are shown in FIG. 27A. In FIG. 27B, the voltage-current characteristic curves for the current controlling TFT 108 show the relation of voltage $V_{DS}$ applied between the source region and the drain region to the amount of current flowing through the drain region of the current controlling TFT 108. The plural curves in FIG. 27B are different from one another in $V_{GS}$ that is the voltage applied between the source region and the gate electrode of the current controlling TFT 108.

As shown in FIG. 27A, the voltage applied between the pixel electrode and the opposite electrode 111 of the EL element 110 is given as $V_{EL}$, and the voltage applied between a terminal 2601 connected to the power supply line and the opposite electrode 111 of the EL element 110 is given as $V_T$. The value of $V_T$ is fixed by the potential of the power supply line. As mentioned above, $V_{DS}$ is the voltage applied between the source region and the drain region of the current controlling TFT 108. $V_{GS}$ is the voltage applied between the gate electrode and the source region of the current controlling TFT 108, specifically, the voltage applied between the source region of the current controlling TFT 108 and a wiring 2602 connected to the gate electrode of the current controlling TFT.

The current controlling TFT 108 may either be an n-channel TFT or a p-channel TFT.

The current controlling TFT 108 and the EL element 110 are connected in series to each other. Therefore the same amount of current flows through both of the elements (the current controlling TFT 108 and the EL element 110). The current controlling TFT 108 and the EL element 110 are driven at the voltage corresponding to intersections (operating points) between the voltage-current characteristic curves of the elements. In FIG. 27B, $V_{EL}$ equals to the voltage between the potential of the opposite electrode 111 and the potential of the operating points. $V_{DS}$ equals to the voltage between the potential at the terminal 2601 of the current controlling TFT 108 and the potential of the operating points. In short, $V_T$ equals to the sum of $V_{EL}$ and $V_{DS}$.

Now, consider a case where $V_{GS}$ is changed. As can be understood from FIG. 27B, an increase in $|V_{GS}-V_{TH}|$, namely $|V_{GS}|$, of the current controlling TFT 108 is followed by an increase in value of current flowing in the current controlling TFT 108. $V_{TH}$ is the threshold voltage of the current controlling TFT 108. Therefore the increase in $|V_{GS}|$ naturally causes an increase in value of current flowing through the EL element 110 at the operating points as can be seen from FIG. 27B. The luminance of the EL element 110 is increased in proportion to the value of current flowing through the EL element.

Since the increase in $|V_{GS}|$ causes an increase in value of current flowing through the EL element 110, the value of $V_{EL}$ is increased in accordance with the increase in current value. The value of $V_T$ is fixed by the potential of the power supply line, so that $V_{DS}$ is reduced when $V_{EL}$ is increased.

As shown in FIG. 27B, the voltage-current characteristic of the current controlling TFT can be divided into two regions in accordance with the values of $V_{GS}$ and $V_{DS}$. The region where $|V_{GS}-V_{TH}|<|V_{DS}|$ is a saturation region, whereas the region where $|V_{GS}-V_{TH}|>|V_{DS}|$ is a linear region.

In the saturation region, the following expression 1 is established.

$$I_{DS}=\beta(V_{GS}-V_{TH})^2/2 \qquad \text{[Expression 1]}$$

where $I_{DS}$ is the value of current flowing through a channel forming region of the current controlling TFT 108, and $\beta=\mu C_o W/L$, with $\mu$ being the mobility of the current controlling TFT 108, $C_o$ being the gate capacitance per unit area, and W/L being the ratio of the channel width W of the channel forming region to the channel length L thereof.

In the linear region, the following expression 2 is established.

$$I_{DS}=\beta\{(V_{GS}-V_{TH})V_{DS}-V_{DS}^2/2\} \qquad \text{[Expression 2]}$$

As can be seen in Expression 1, the current value in the saturation region is hardly changed by $V_{DS}$ and is determined only by $V_{GS}$.

On the other hand, Expression 2 shows that the current value is determined by $V_{dS}$ and $V_{GS}$ in the linear region. As $|V_{GS}|$ is increased, the current controlling TFT 108 comes to operate at a voltage of the linear region, gradually increasing $V_{EL}$. Therefore $V_{DS}$ is reduced in accordance with the increase in $V_{EL}$. In the linear region, the amount of current is reduced when $V_{DS}$ is reduced. Then it is difficult to increase the current value by increasing $|V_{GS}|$. The current value reaches $I_{MAX}$ when $|V_{GS}|=\infty$. In other words, it is impossible to flow a current greater than $I_{MAX}$ no matter how large the $|V_{GS}|$ value is. $I_{MAX}$ is the value of current flowing through the EL element 110 when $V_{EL}=V_T$.

By thus controlling the value of $|V_{GS}|$, the operating points can be set in either the saturation region or the linear region.

Ideally, characteristics of all current controlling TFTs are the same. However, in reality, current controlling TFTs are often different from one another in threshold $V_{TH}$ and in mobility $\mu$. When the current controlling TFTs are different from one another in threshold $V_{TH}$ and mobility $\mu$, as can be understood from Expressions 1 and 2, different amounts of current flow through the channel forming regions of the current controlling TFTs in spite of being given the same $V_{GS}$.

Figure 28:
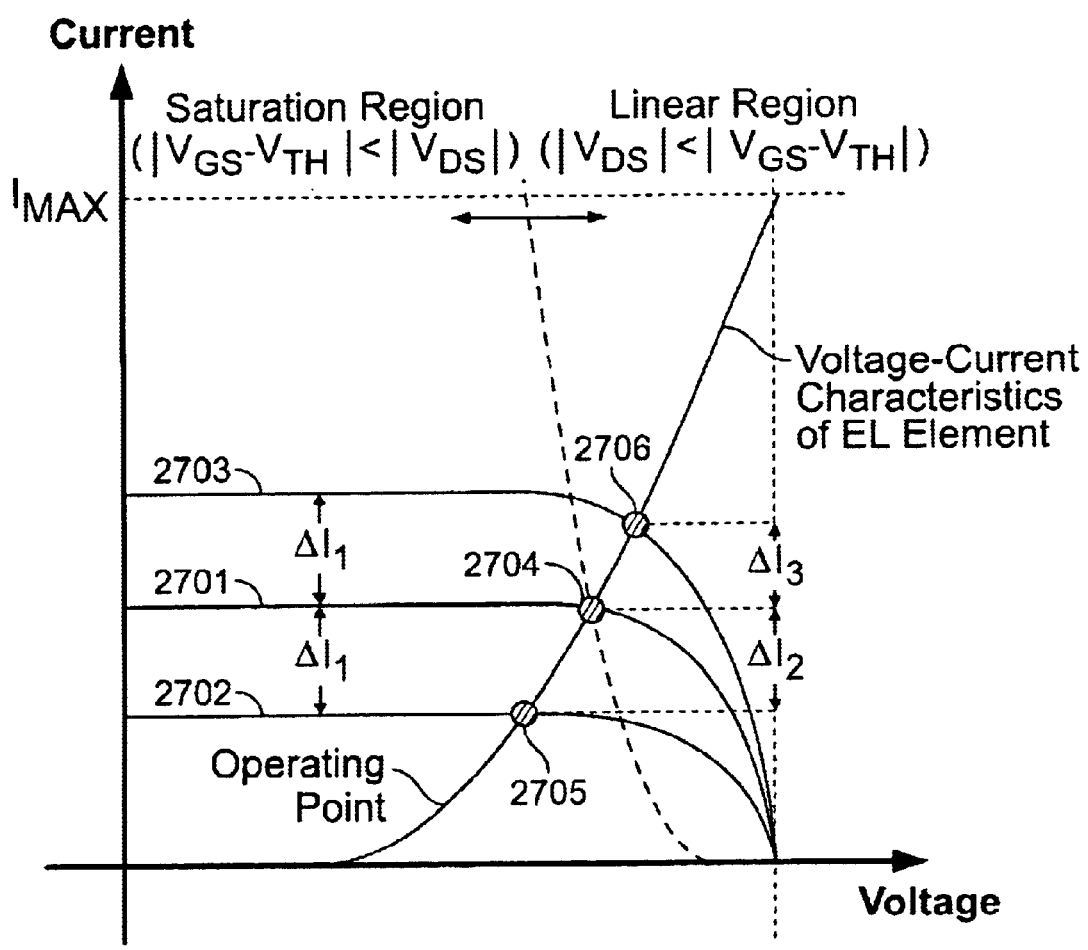
FIG. 28 is a graph showing voltage-current characteristics of an EL element and a current controlling TFT.

FIG. 28 shows voltage-current characteristics of current controlling TFTs that are different from one another in threshold $V_{TH}$ and in mobility $\mu$. A solid line 2701 represents the ideal current-voltage characteristic, whereas solid lines 2702 and 2703 represent current-voltage characteristics of current controlling TFTs where the threshold $V_{TH}$ and the mobility $\mu$ deviate from the ideal values. In the saturation rage, the current-voltage characteristic curves 2702 and 2703 deviate from the ideal current-voltage characteristic curve 2701 by the same current value $\Delta I_1$. An operating point 2705 on the current-voltage characteristic curve 2702 is in the saturation region, whereas an operating point 2706 on the current-voltage characteristic curve 2703 is in the linear region. Under this condition, $\Delta I_2$ and $\Delta I_3$ are respectively given as the difference between the current value at the operating point 2705 and the current value at an operating point 2704 on the ideal current-voltage characteristic curve 2701 and the difference between the current value at the operating point 2706 and the current value at the operating point 2704. The current value at the operating point 2706 in the linear region is smaller than the current value at the operating point 2705 in the saturation region.

When employing the digital driving method according to the present invention, irregularity in luminance of the EL elements due to fluctuation in characteristic of current controlling TFTs can therefore be diminished in gray scale display by driving the current controlling TFTs and the EL elements such that the operating points are in the linear region.

On the other hand, in the case of the conventional analog driving method, it is preferred to drive the current controlling TFTs and the EL elements such that the operating points are in the saturation region where the current value is determined only by $|V_{GS}|$.

Figure 29:
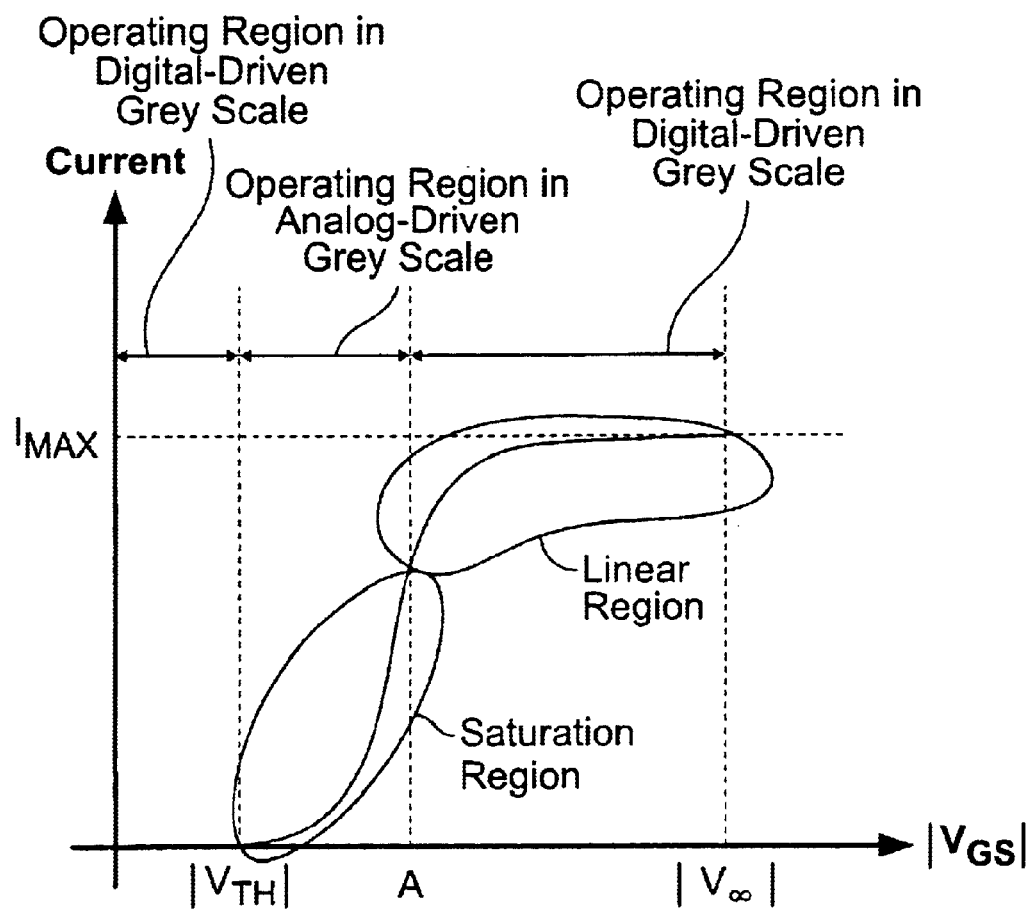
FIG. 29 is a graph showing the relation between the gate voltage and the drain current in a current controlling TFT.

To conclude the above operation analysis, FIG. 29 shows a graph representing the relation between the current value and the gate voltage $|V_{GS}|$ of the current controlling TFT. As $|V_{GS}|$ is increased and exceeds the absolute value of the threshold of the current controlling TFT, i.e., $|V_{TH}|$, current begins to flow through the current controlling TFT. The $|V_{GS}|$ at this point is called herein a lighting starting voltage. $|V_{GS}|$ is further increased until it reaches a value that satisfies $|V_{GS}-V_{TH}|=|V_{DS}|$ (this value is tentatively denoted by A), leaving a saturation region 2801 and arriving in a linear region 2802. When $|V_{GS}|$ is increased even further, the current value is increased until it finally saturates. At this point, $|V_{GS}|=\infty$.

FIG. 29 shows that almost no current flows in a region where $|V_{GS}|\leq|V_{TH}|$. A region where $|V_{TH}|\leq|V_{GS}|\leq A$ is the saturation region, and the current value in this region is changed by $|V_{GS}|$. On the other hand, a region where $A\leq|V_{GS}|$ is the linear region, and the value of the current flowing through the EL element is changed there by $|V_{GS}|$ and $|V_{DS}|$.

According to the digital driving method of the present invention, the use of the voltage in a region where $|V_{GS}|\leq|V_{TH}|$ and in the linear region where $A\leq|V_{GS}|$ is preferred.

This embodiment can be freely combined with any of the other embodiments of the present invention.

[Embodiment 14]

If an EL material that emits light utilizing phosphorescence from a triplet exciton is used in the present invention, the external light emission quantum efficiency can be enhanced in leap and bounds. This makes the EL element to consume less power and last longer, in addition to making it light-weight.

Cited here are reports in which a triplet exciton is used to improve the external light emission quantum efficiency.

(T. Tsutsui, C. Adachi, S. Saito, Photochemical Processes in Organized Molecular Systems, ed. K. Honda, (Elsevier Sci. Pub., Tokyo, 1991) p. 437.)

The molecular formula of the EL material (coumarin pigment) reported in the above article is shown below.

[Chemical Formula 1]

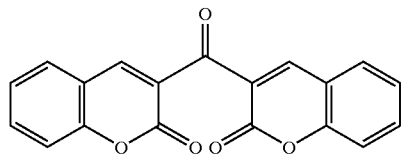

(M. A. Baldo, D. F. O'Brien, Y. You, A. Shoustikov, S. Sibley, M. E. Thompson, S. R. Forrest, Nature 395 (1998) p. 151.)

The molecular formula of the EL material (Pt complex) reported in the above article is shown below.

[Chemical Formula 2]

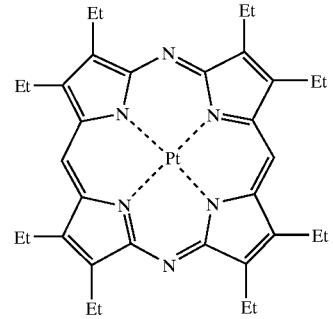

(M. A. Baldo, S. Lamansky, P. E. Burrows, M. E. Thompson, S. R. Forrest, Appl. Phys. Lett., 75 (1999) p. 4.)

(T. Tsutsui, M. J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.)

The molecular formula of the EL material (Ir complex) reported in the above article is shown below.

[Chemical Formula 3]

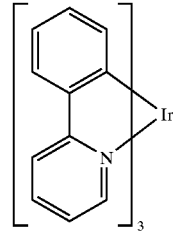

If the phosphorescent light emission from a triplet exciton can be utilized as above, theoretically, it is possible to obtain the external light emission quantum efficiency three to four times higher than that of the case of using fluorescent light emission from a singlet exciton.

This embodiment can be freely combined with any of the other embodiments of the present invention.

Carrying out the present invention makes it possible to obtain an active matrix self-luminous device that is capable of clear, multi-gray scale, color display and is not affected by fluctuation in characteristics of TFTs. Specifically, the active matrix self-luminous device employs time division gray scale display by means of a digital signal, instead of conventional analog gray scale display. Thus default in gray scale due to fluctuation in characteristic of current controlling TFTs is eliminated to thereby display an image with excellent color reproducibility and high definition.

Furthermore, the TFTs formed on the substrate are different in structure so that a TFT having the optimum structure for the performance needed in a circuit or element is allocated to the circuit or element. This provides the active matrix self-luminous device with high reliability.

An electric machine provided with such an active matrix self-luminous device as a display can display a high quality image and can demonstrate high reliability and high performance.

What is claimed is:

1. An electronic device having at least one self-light emitting device comprising:

a first semiconductor island formed on an insulating surface, said first semiconductor island having at least first and second impurity regions and a channel region therebetween;

a second semiconductor island formed on said insulating surface, said second semiconductor island separated from said first semiconductor island;

an insulating film formed on said first semiconductor island and said second semiconductor island;

a gate electrode formed over said first semiconductor island with said insulating film interposed therebetween;

a capacitor forming electrode formed over said second semiconductor island with said insulating film interposed therebetween, wherein said gate electrode and said capacitor forming electrode are formed in a same conductive layer and electrically connected to each other; and a light emitting element comprising a cathode, an anode and a light emitting material interposed between said cathode and said anode wherein one of said first and second impurity regions is electrically connected to one of said cathode and said anode.

2. The electronic device according to claim 1 wherein said electronic device is selected from the group consisting of a cellular phone, a personal computer, a video camera, a goggle type display, a portable computer, a DVD and an EL display.

3. The electronic device according to claim 1 further comprising a switching thin film transistor having a drain region electrically connected to said gate electrode.

4. An electronic device having at least one self-light emitting device comprising:

a first semiconductor island formed on an insulating surface, said first semiconductor island having at least first and second impurity regions and a channel region therebetween;

a second semiconductor island formed on said insulating surface, said second semiconductor island separated from said first semiconductor island;

an insulating film formed on said first semiconductor island and said second semiconductor island;

a gate electrode formed over said first semiconductor island with said insulating film interposed therebetween;

a capacitor forming electrode formed over said second semiconductor island with said insulating film interposed therebetween wherein said gate electrode and said capacitor forming electrode are formed in a same conductive layer and electrically connected to each other;

a capacitor having said capacitor forming electrode and said second semiconductor island with said insulating film interposed therebetween;

an interlayer insulating film formed over said capacitor forming electrode;

a current supply line formed over said interlayer insulating film wherein said current supply line is electrically connected to one of said first and second impurity regions of the first semiconductor island; and a light emitting element comprising a cathode, an anode and a light emitting material interposed between said cathode and said anode wherein the other one of said first and second impurity regions is electrically connected to one of said cathode and said anode, wherein said second semiconductor island is covered by said current supply line.

5. The electronic device according to claim 4 wherein said electronic device is selected from the group consisting of a cellular phone, a personal computer, a video camera, a goggle type display, a portable computer, a DVD and an EL display.

6. The electronic device according to claim 4 further comprising a switching thin film transistor having a drain region electrically connected to said gate electrode.

7. The electronic device according to claim 4 wherein said first and second semiconductor islands comprise crystalline silicon.

8. The electronic device according to claim 4 further comprising a driver circuit formed on said insulating surface, said driver circuit comprising thin film transistors having a crystalline channel region.

9. An electronic device having at least one self-light emitting device comprising:

a gate wiring formed over a substrate;

a first switching element formed over said substrate and including at least one first thin film transistor wherein a gate electrode of said first thin film transistor is electrically connected to said gate wiring;

a source wiring extending across said gate wiring;

a second switching element formed over said substrate and including at least one second thin film transistor, said second thin film transistor comprising a semiconductor island having at least first and second impurity regions and a channel region, a gate insulating film formed on said semiconductor island and a gate electrode formed on said gate insulating film, wherein said gate electrode is electrically connected to said source wiring through at least said first switching element;

a current supply line extending across said gate wiring and electrically connected to one of said first and second impurity regions of the second thin film transistor;

a capacitor electrically connected between said gate electrode of the second thin film transistor and said current supply line wherein said capacitor is covered by said current supply line; and a light emitting element comprising a cathode, an anode and a light emitting material interposed between said cathode and said anode wherein the other one of said first and second impurity regions is electrically connected to one of said cathode and said anode.

10. The electronic device according to claim 9 wherein said electronic device is selected from the group consisting of a cellular phone, a personal computer, a video camera, a goggle type display, a portable computer, a DVD and an EL display.

11. The electronic device according to claim 9 wherein said semiconductor island comprises crystalline silicon.

12. The electronic device according to claim 9 further comprising a driver circuit formed over said substrate, said driver circuit comprising thin film transistors having a crystalline channel region.

13. An electronic device having at least one self-light emitting device comprising:

a gate wiring formed over a substrate;

a first switching element formed over said substrate and including at least one first thin film transistor wherein a gate electrode of said first thin film transistor is electrically connected to said gate wiring;

a source wiring extending across said gate wiring;

a second switching element formed over said substrate and including at least one second thin film transistor, said second thin film transistor comprising a semiconductor island having at least first and second impurity regions and a channel region, a gate insulating film formed on said semiconductor island and a gate electrode formed on said gate insulating film, wherein said gate electrode is electrically connected to said source wiring through at least said first switching element;

a current supply line extending across said gate wiring and electrically connected to one of said first and second impurity regions of the second thin film transistor;

a capacitor having a first electrode comprising a same material as said semiconductor island, a second electrode comprising a same material as the gate electrode of the second thin film transistor and electrically connected to said gate electrode of the second thin film transistor and an insulating film comprising a same material as said gate insulating film between said first and second gate electrodes wherein said capacitor is located below said current supply line; and a light emitting element comprising a cathode, an anode and a light emitting material interposed between said cathode and said anode wherein the other one of said first and second impurity regions is electrically connected to one of said cathode and said anode;

wherein said first electrode is separated from said semiconductor island and is electrically connected to said current supply line.

14. The electronic device according to claim 13 wherein said electronic device is selected from the group consisting of a cellular phone, a personal computer, a video camera, a goggle type display, a portable computer, a DVD and an EL display.

15. The electronic device according to claim 13 wherein said semiconductor island comprises crystalline silicon.

16. The electronic device according to claim 13 further comprising a driver circuit formed over said substrate, said driver circuit comprising thin film transistors having a crystalline channel region.

* * * * *